US012765006B2

(12) United States Patent
Shimomura et al.

(10) Patent No.: US 12,765,006 B2
(45) Date of Patent: Oct. 13, 2026

(54) MOSFET INCLUDING HEAVY METAL TO IMPROVE REVERSE RECOVERY CHARACTERISTICS

(71) Applicants: Kabushiki Kaisha Toshiba, Tokyo (JP); Toshiba Electronic Devices & Storage Corporation, Tokyo (JP)

(72) Inventors: Saya Shimomura, Kanazawa (JP); Hiroaki Katou, Nonoichi (JP); Tsuyoshi Kachi, Kanazawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 338 days.

(21) Appl. No.: 18/597,245

(22) Filed: Mar. 6, 2024

(65) Prior Publication Data

US 2025/0098233 A1 Mar. 20, 2025

(30) Foreign Application Priority Data

Sep. 14, 2023 (JP) ................................ 2023-149494

(51) Int. Cl.

*H10D 62/10* (2025.01)
*H10D 62/80* (2025.01)
*H10D 84/00* (2025.01)

(52) U.S. Cl.

CPC ........... *H10D 62/103* (2025.01); *H10D 62/80* (2025.01); *H10D 84/144* (2025.01)

(58) Field of Classification Search

CPC ...... H10D 30/66; H10D 30/668; H10D 62/80; H10D 62/103; H10D 84/144
See application file for complete search history.

(56) References Cited

U.S. PATENT DOCUMENTS 10,559,663 B2 2/2020 Naito
11,522,058 B2 12/2022 Kachi
(Continued)

FOREIGN PATENT DOCUMENTS

JP 2014146666 A 8/2014
JP 2022-042526 A 3/2022
(Continued)

OTHER PUBLICATIONS

Notice of Reasons for Refusal (Office Action) dated Jul. 1, 2026, mailed in counterpart Japanese Patent Application No. 2023-149494, with English machine translation, 10 pages.

*Primary Examiner* — Nelson Garces
(74) *Attorney, Agent, or Firm* — Kim & Stewart LLP

(57) ABSTRACT

A semiconductor device includes first and second electrodes, a semiconductor part located between the first and second electrodes, a gate electrode located between the semiconductor part and the second electrode, and a structure body extending in the semiconductor part under the gate electrode. The semiconductor part includes first to fifth layers which are stacked in this order. The first to third and fifth layers are of a first conductivity type. The fourth layer is of a second conductivity type. The gate electrode faces the fourth layer. The structure body includes an insulating film, a conductive body, an insulating layer, and a silicide layer. The silicide layer is located at a lower end of the structure body. The lower end of the structure body contacts the second layer. The second layer includes a heavy metal. The third layer has a lower concentration of the heavy metal than the second layer.

10 Claims, 16 Drawing Sheets

(56) References Cited

U.S. PATENT DOCUMENTS

| | | | | |
|---|---|---|---|---|
| 2014/0209999 | A1 | 7/2014 | Sato et al. | |
| 2014/0374882 | A1 | 12/2014 | Siemieniec et al. | |
| 2018/0108737 | A1 | 4/2018 | Naito | |
| 2022/0069072 | A1 | 3/2022 | Hoshi | |
| 2022/0077293 | A1* | 3/2022 | Shimomura | H10D 64/117 |
| 2022/0085177 | A1* | 3/2022 | Kachi | H10D 64/117 |
| 2022/0246606 | A1 | 8/2022 | Gejo et al. | |
| 2022/0285548 | A1* | 9/2022 | Katou | H10D 64/2527 |
| 2022/0310837 | A1* | 9/2022 | Baba | H10D 30/668 |
| 2023/0402511 | A1 | 12/2023 | Kubouchi et al. | |

FOREIGN PATENT DOCUMENTS

| | | | |
|---|---|---|---|
| JP | 2022-047378 | A | 3/2022 |
| JP | 2022-116567 | A | 8/2022 |
| JP | 2022-135310 | A | 9/2022 |
| JP | 2022-141955 | A | 9/2022 |
| JP | 2022-148177 | A | 10/2022 |
| WO | 2023042886 | A1 | 3/2023 |

* cited by examiner

MOSFET INCLUDING HEAVY METAL TO IMPROVE REVERSE RECOVERY CHARACTERISTICS

CROSS-REFERENCE TO RELATED APPLICATIONS

This application is based upon and claims the benefit of priority from Japanese Patent Application No. 2023-149494, filed on Sep. 14, 2023; the entire contents of which are incorporated herein by reference.

FIELD

Embodiments relate to a semiconductor device.

BACKGROUND

A Metal Oxide Semiconductor Field Effect Transistor (MOSFET) includes a diode connected in anti-parallel. It is favorable to improve reverse recovery characteristics in the diode operation.

In a known method to improve the reverse recovery characteristics in the diode operation, the minority carrier lifetime in the drift layer is controlled by introducing a heavy metal or the like to the drift layer.

DETAILED DESCRIPTION

A semiconductor device according to an embodiment includes a first electrode, a second electrode, a semiconductor part located between the first electrode and the second electrode, a gate electrode that is located in the semiconductor part and extends from the second electrode toward the first electrode, and a structure body that is located between the gate electrode and the first electrode and extends from the gate electrode side toward the first electrode side in the semiconductor part. The semiconductor part includes: a first layer that is located on the first electrode, is electrically connected to the first electrode, and is of a first conductivity type; a second layer that is located on the first layer, includes a heavy metal, and is of the first conductivity type; a third layer that is located on the second layer, includes the heavy metal, has a lower concentration of the heavy metal than the second layer, and is of the first conductivity type; a fourth layer that is located on the third layer, faces the gate electrode via a gate insulating film, is electrically connected to the second electrode, and is of a second conductivity type; and a fifth layer that is located on the fourth layer, is electrically connected to the second electrode, and is of the first conductivity type. The structure body includes: a silicide layer contacting the second layer;

an insulating layer located on the silicide layer; a conductive body that is located on the insulating layer, extends from under the gate electrode toward the insulating layer, and is electrically isolated from the gate electrode; and an insulating film that is located between the conductive body and the second layer and between the conductive body and the third layer. A bottom surface of the silicide layer and at least a portion of a side surface of the silicide layer contact the second layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

First Embodiment

Figure 1:
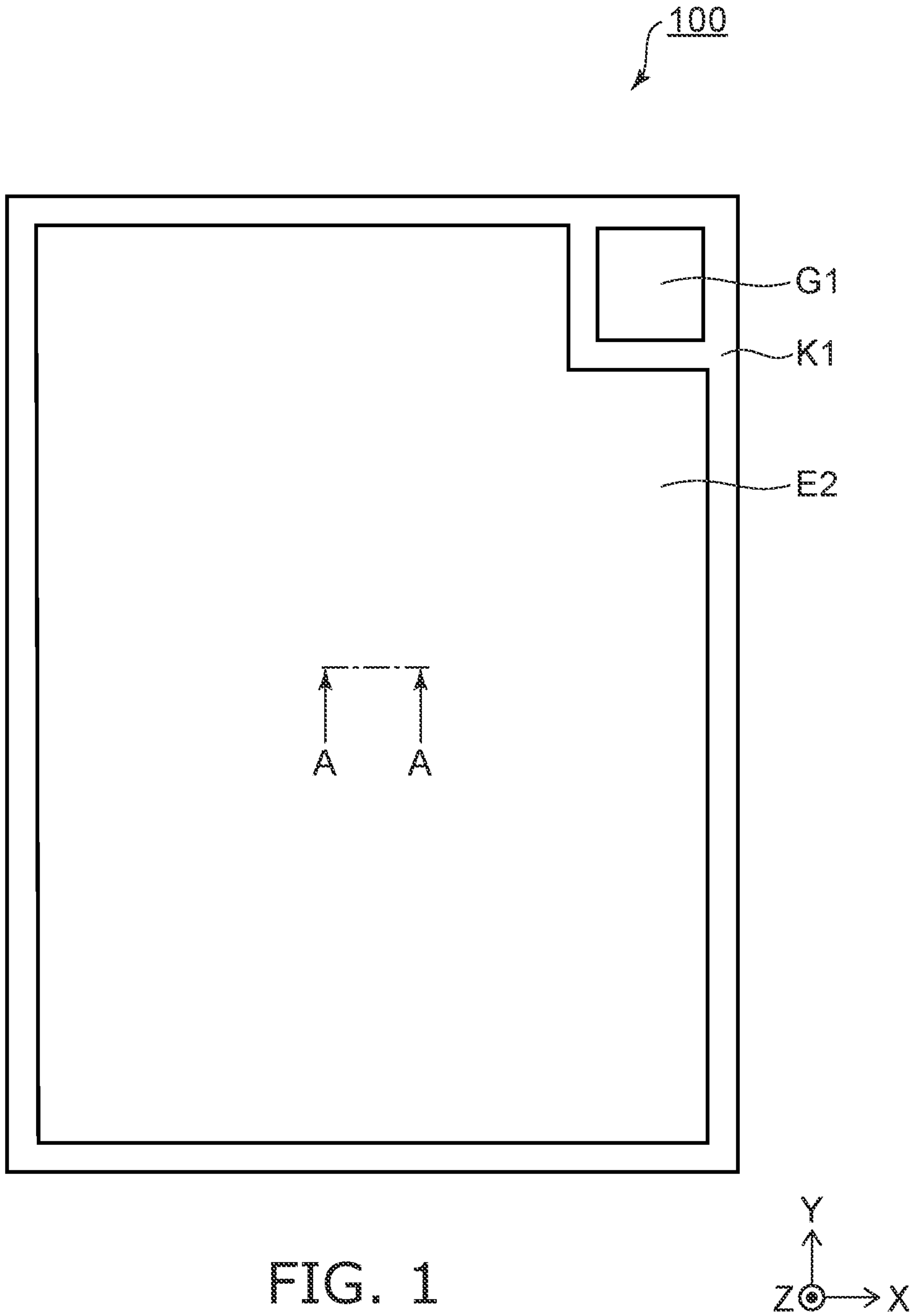
FIG. 1 is a schematic plan view illustrating a semiconductor device according to a first embodiment.

FIG. 1 is a schematic plan view illustrating a semiconductor device according to a first embodiment.

Figure 2:
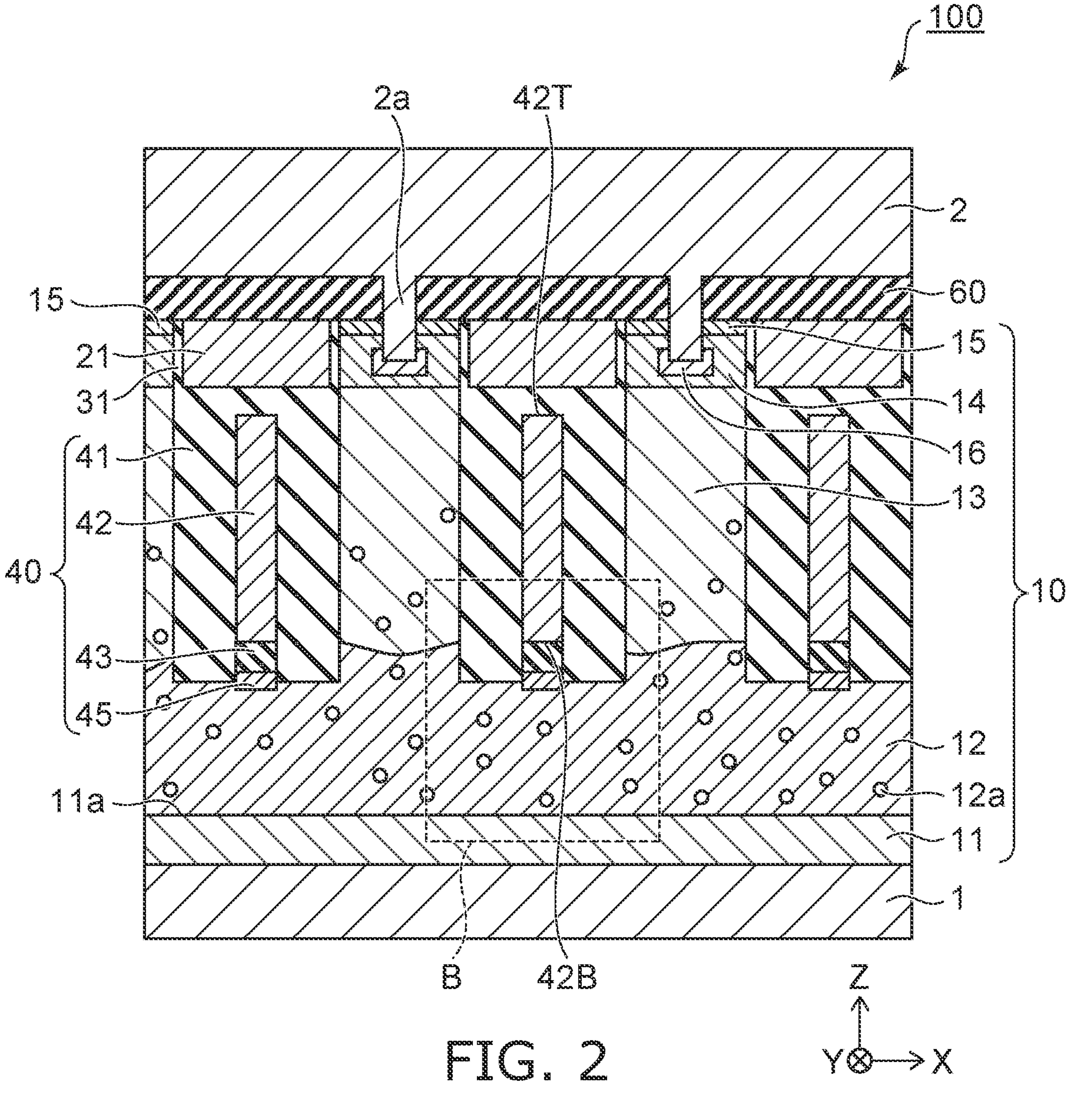
FIG. 2 is a schematic auxiliary cross-sectional view along line the AA of FIG. 1.

FIG. 2 is a schematic auxiliary cross-sectional view along line the AA of FIG. 1.

Figure 3:
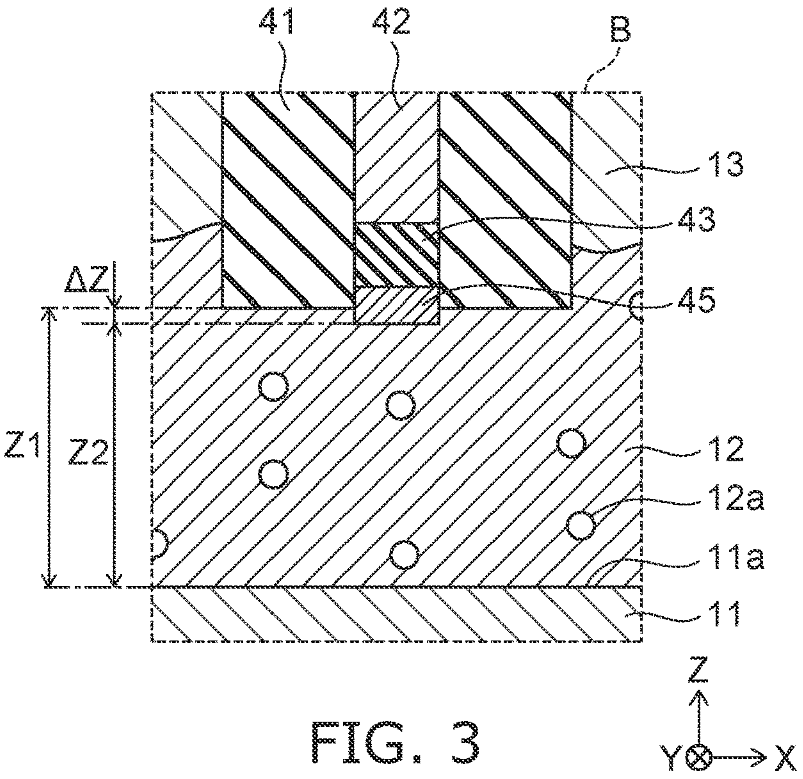
FIG. 3 is an enlarged schematic view of portion B of FIG. 2.

FIG. 3 is an enlarged schematic view of portion B of FIG. 2.

As shown in FIGS. 1 and 2, the semiconductor device 100 according to the embodiment includes a first electrode 1, a second electrode 2, a semiconductor part 10, a gate electrode 21, and a structure body 40. The semiconductor part 10 is located between the first electrode 1 and the second electrode 2. The first electrode 1 is located at the back surface of the semiconductor part 10 and functions as a drain electrode. The second electrode 2 is located at the front side of the semiconductor part 10 and functions as a source electrode E2. The gate electrode 21 faces the semiconductor part 10 via a gate insulating film 31. The gate electrode 21 is electrically connected to a gate electrode pad G1. The source electrode E2 and the gate electrode pad G1 are arranged to be separated from each other when viewed in plan and are electrically isolated. Although an insulating layer K1 may be provided between the source electrode E2 and the gate electrode pad G1 as in the example, the insulating layer K1 may not be provided between the source electrode E2 and the gate electrode pad G1.

The semiconductor device 100 is a MOSFET in which the first electrode 1 is used as a drain electrode, the second electrode 2 is used as the source electrode E2, and the gate electrode 21 is included. When the semiconductor device 100 is an n-channel MOSFET, in the diode operation of the semiconductor device 100, the first electrode 1 functions as a cathode electrode; and the second electrode 2 functions as an anode electrode. When the semiconductor device 100 is a p-channel MOSFET, the first electrode 1 functions as an anode electrode; and the second electrode 2 functions as a cathode electrode.

As shown in FIG. 2, the semiconductor part 10 includes a first layer 11, a second layer 12, a third layer 13, a fourth layer 14, and a fifth layer 15. The first layer 11, the second layer 12, the third layer 13, and the fifth layer 15 are semiconductor layers of a first conductivity type. The fourth layer is a semiconductor layer of a second conductivity type. The semiconductor part 10 further includes a sixth layer 16. The sixth layer 16 is a semiconductor layer of the second conductivity type. The semiconductor part 10 includes, for example, Si.

The first layer 11 is located on the first electrode 1. The first layer 11 is a semiconductor substrate.

The second layer 12 is located on the first layer 11. The first-conductivity-type impurity concentration of the second layer 12 is less than the first-conductivity-type impurity concentration of the first layer 11. The second layer 12 includes a heavy metal **12*a* in addition to the first-conductivity-type impurity. The heavy metal 12*a* is, for example, platinum (Pt) or gold (Au). The concentration of Pt or Au in the second layer 12 is $1\times10^{13}$ $cm^{-3}$ to $1\times10^{20}$ $cm^{-3}$. The second layer 12 is an n-type drift layer to which the heavy metal 12*a*** is introduced.

Although the second layer 12 is located on the first layer 11 and contacts the first layer 11 in the specific example shown in FIG. 2, a semiconductor layer that has a first-conductivity-type impurity concentration substantially equal to the first-conductivity-type impurity concentration of the second layer and has a lower concentration of the heavy metal **12*a* than the second layer 12 may be located between the second layer 12 and the first layer 11**.

The third layer 13 is located on the second layer 12. The first-conductivity-type impurity concentration of the third layer 13 is substantially equal to the first-conductivity-type impurity concentration of the second layer 12 and less than the first-conductivity-type impurity concentration of the first layer 11. The third layer 13 is, for example, an n-type drift layer.

The third layer 13 may include the heavy metal **12*a*. The concentration of the heavy metal 12*a* in the third layer 13 is less than the concentration of the heavy metal 12*a* in the second layer 12. Favorably, the concentration of the heavy metal 12*a* in the third layer 13 is substantially zero. For example, the concentration of the heavy metal 12*a* in the third layer 13 decreases away from the second layer 12. By setting the concentration of the heavy metal 12*a* in the third layer 13 to be sufficiently low, a leakage current when a reverse bias is applied between the first electrode 1 and the second electrode 2 when the semiconductor device 100** is in the off-state can be reduced.

The fourth layer 14 is located on the third layer 13. The fourth layer 14 is, for example, a p-type base layer.

The fifth layer 15 is located on the fourth layer 14. The first-conductivity-type impurity concentration of the fifth layer 15 is greater than the first-conductivity-type impurity concentration of the second layer 12 and greater than the first-conductivity-type impurity concentration of the third layer 13. The fifth layer 15 is, for example, an n-type contact layer.

The sixth layer 16 is selectively provided on the third layer 13. The fourth layer 14 is located on the sixth layer 16. The fourth layer 14 is located at the side surface of the sixth layer 16. The second-conductivity-type impurity concentration of the sixth layer 16 is greater than the second-conductivity-type impurity concentration of the fourth layer 14. The sixth layer 16 is, for example, a p-type contact layer.

An inter-layer insulating film 60 is located on the fifth layer 15. The second electrode 2 is located on the inter-layer insulating film 60.

The second electrode 2 includes a connection part **2*a* that extends through the inter-layer insulating film 60. The connection part 2*a* extends through the fifth and fourth layers 15 and 14 and reaches the sixth layer 16. The connection part 2*a* is electrically connected to the fifth, fourth, and sixth layers 15, 14, and 16. The fifth layer 15, the fourth layer 14, and the sixth layer 16 are electrically connected to the second electrode 2 via the connection part 2***a*.

An XYZ coordinate system may be used in the following description. The first layer 11 includes a first surface 11*a*. The first surface 11*a* is a plane. The second layer 12 is located on the first surface 11*a*. The XY-plane is parallel to the first surface 11*a*. The direction from the first electrode 1 toward the second electrode 2 is taken as the direction of a Z-axis, and may be called a Z-direction. The semiconductor device 100 being viewed along the Z-direction is referred to as being viewed in plan.

The gate electrode 21 is located between the second electrode 2 and the first electrode 1. The gate electrode 21 extends in the Z-direction in the semiconductor part 10. Multiple gate electrodes 21 are included. In the example of FIG. 2, multiple gate electrodes 21 are arranged at uniform spacing in the direction of an X-axis. For example, the multiple gate electrodes 21 also are arranged at uniform spacing in the direction of a Y-axis. For example, the gate electrodes 21 are arranged in a matrix configuration when viewed in plan.

The gate electrode 21 faces the fourth layer 14 via the gate insulating film 31. In the specific example of FIG. 2, the gate electrode 21 faces the fifth layer 15 via the gate insulating film 31. The gate electrode 21 also may face a portion of the third layer 13 via the gate insulating film 31.

The gate electrode 21 includes, for example, polycrystalline Si including an impurity of the first conductivity type.

The structure body 40 is located between the gate electrode 21 and the first electrode 1. The structure body 40 extends in the Z-direction in the semiconductor part 10. The structure body 40 contacts the third layer 13 at the side surface of the structure body 40. The structure body 40 contacts the second layer 12 at the bottom surface of the structure body 40. The structure body 40 contacts the second layer 12 at a portion of the side surface continuous with the bottom surface of the structure body 40.

The structure body 40 includes an insulating film 41, a conductive body 42, an insulating layer 43, and a silicide layer 45. The conductive body 42 extends in the Z-direction below the gate electrode 21. The insulating film 41 is located between the gate electrode 21 and the conductive body 42. The conductive body 42 is located on the insulating layer 43. The insulating layer 43 is located on the silicide layer 45. The silicide layer 45 is located on the second layer 12.

The insulating film 41 extends in the Z-direction below the gate electrode 21. In the specific example of FIG. 2, the insulating film 41 is continuous with the gate insulating film 31.

The insulating film 41 surrounds the perimeters of the conductive body 42, the insulating layer 43, and the silicide layer 45. The silicide layer 45 contacts the second layer 12 on the second layer 12; and the second layer 12 contacts the bottom surface of the silicide layer 45 and a portion of the side surface of the silicide layer 45 continuous with the bottom surface.

As shown in FIG. 3, the lower end of the insulating film 41 is separated from the first surface 11*a* by a distance Z1 in the Z-direction. The lower end of the silicide layer 45 is separated from the first surface 11*a* by a distance Z2 in the Z-direction. The relationship of the distances Z1 and Z2 is $Z1>Z2$, so that $Z1-Z2=\Delta Z>0$. That is, the silicide layer 45 protrudes toward the second layer 12 from the insulating film 41 of the structure body 40.

In the structure body 40, the conductive body 42 extends in the Z-direction and faces the third layer 13 via the insulating film 41. The conductive body 42 functions as a field plate and relaxes the electric field generated in the third layer 13 by the reverse-biased voltage applied between the first electrode 1 and the second electrode 2. It is favorable for the conductive body 42 to face the third layer 13 via the insulating film 41 from an upper end 42T to a lower end 42B of the conductive body 42.

The insulating film 41 and the insulating layer 43 include, for example, silicon oxide. The crystal structure of the insulating film 41 and the crystal structure of the insulating layer 43 may be different. The conductive body 42 includes, for example, polycrystalline Si including an impurity of the first conductivity type. The silicide layer 45 includes, for example, Pt and Pt silicide.

Operations and effects of the semiconductor device 100 according to the embodiment will now be described.

Operations of the semiconductor device 100 in which the first conductivity type is the n-type and the second conductivity type is the p-type will now be described.

First, the operation in the off-state of the semiconductor device 100 will be described. In the semiconductor device 100, by applying, to the gate electrode 21, a voltage with respect to the second electrode 2 that is sufficiently less than the gate threshold voltage, an inversion layer is not formed at the surface of the third layer 13 facing the gate electrode 21. Therefore, a channel is not formed in the third layer 13; and the semiconductor device 100 is set to the off-state. When a high voltage with respect to the second electrode 2 is applied to the first electrode 1, a reverse bias state is formed between the third layer 13 and the fourth layer 14.

The conductive body 42 functions as a field plate. Therefore, an electric field due to the voltage applied between the first electrode 1 and the second electrode 2 is generated from the third layer 13 toward the conductive body 42.

A depletion layer is formed in the third layer 13 by the electric field generated between the conductive body 42 and the third layer 13. The depletion layer extends in the third layer 13 along the direction of the electric field. Because the structure bodies 40 are arranged in the X-direction and Y-direction, the depletion layers due to adjacent structure bodies 40 connect with each other and are continuous. That is, in the reverse bias state, the depletion layer is formed over the entire third layer 13; and the entire third layer 13 is depleted.

Leakage current occurs when crystal defects are present in the depleted third layer 13. In particular, when the heavy metal 12*a* is introduced to the third layer 13, the leakage current is increased by the heavy metal agglomerating in the crystal defects. In the semiconductor device 100 according to the embodiment, the leakage current is suppressed because the concentration of the heavy metal 12*a* in the third layer 13 is sufficiently less than the concentration of the heavy metal 12*a* in the second layer 12.

When a voltage that is higher than that of the first electrode 1 is applied to the second electrode 2 when the semiconductor device 100 is in the off-state, holes, which are the minority carriers, are injected from the fourth layer 14 into the third layer 13. The holes are supplied to the second layer 12 via the third layer 13. On the other hand, electrons are supplied from the first layer 11 to the second layer 12. As a result, a current flows from the second electrode 2 toward the first electrode 1. The current is equivalent to an operation in which a current flows in a diode in which the second electrode 2 is the anode electrode and the first electrode 1 is the cathode electrode. Such an operation may be called a diode operation.

When the holes are injected by the diode operation, carriers accumulate in the second layer 12. When a higher voltage than that of the second electrode 2 is applied to the first electrode 1 in this state, a reverse recovery current due to the accumulated carriers flows. Because the mobility of holes is low, a current continues to flow even after the electrons are discharged.

In the semiconductor device 100 according to the embodiment, the second layer 12 includes the heavy metal 12*a* and has a higher concentration of the heavy metal 12*a* than the third layer 13. The heavy metal 12*a* functions as recombination centers, and so the excess holes are annihilated by recombining with the heavy metal 12*a*. By appropriately setting the concentration of the heavy metal 12*a* in the second layer 12, the excess holes can be substantially annihilated, and the reverse recovery time after the current is carried by the diode operation can be reduced.

Due to the effect of the electric field relaxation by the field plate of the conductive body 42, the impurity concentration of the third layer 13 can be increased, and so the on-resistance of the semiconductor device 100 can be reduced. The accumulated carriers can be increased because the impurity concentration of the third layer 13 is high, while the reverse recovery time is reduced by the heavy metal 12*a*. Thus, according to the embodiment, low on-resistance and reduced reverse recovery time can be realized in a MOSFET using a field plate.

Operations of the semiconductor device 100 in the on-state will now be described. In the semiconductor device 100, by applying, to the gate electrode 21, a voltage with respect to the second electrode 2 that is sufficiently greater than the gate threshold voltage, an inversion layer is formed at the surface of the third layer 13 facing the gate electrode 21. The inversion layer of the third layer 13 functions as a channel.

By applying, to the first electrode 1, a high voltage with respect to the second electrode 2, electrons supplied from the fifth layer 15 travel through the third layer 13, the second layer 12, and the first layer 11 via the inversion layer and reach the first electrode 1. That is, the on-resistance of the semiconductor device 100 is the sum of the resistances of each layer of the first to fifth layers 11 to 15; and the on-resistance can be reduced as the resistance values of the first to fifth layers 11 to 15 decrease.

As described above, the semiconductor device 100 according to the embodiment includes the structure body 40 that extends through the third layer 13 in the Z-direction. The electric field when a reverse bias is applied is converted by the structure body 40 into a direction orthogonal to the Z-direction. By setting the length of the conductive body 42 facing the third layer 13 to be sufficient, the electric field between the conductive body 42 and the third layer 13 can be reduced, and a sufficient breakdown voltage can be realized without reducing the impurity concentrations of the second layer 12 and the third layer 13. Therefore, the on-resistance of the semiconductor device 100 is reduced.

Thus, the semiconductor device 100 according to the embodiment has a configuration in which the depletion layer that is formed in the off-state is formed substantially in the third layer 13 and not formed in the second layer 12, so that a low leakage current and improved reverse recovery characteristics can be realized.

To form the depletion layer in the third layer 13, the structure body 40 includes the conductive body 42 that extends in the Z-direction. Therefore, the resistance value of the third layer 13 can be reduced, and the on-resistance of the semiconductor device 100 is reduced.

A method for manufacturing the semiconductor device 100 according to the embodiment will now be described.

FIGS. 4 to 22 are schematic cross-sectional views illustrating the method for manufacturing the semiconductor device according to the first embodiment.

Figure 4:
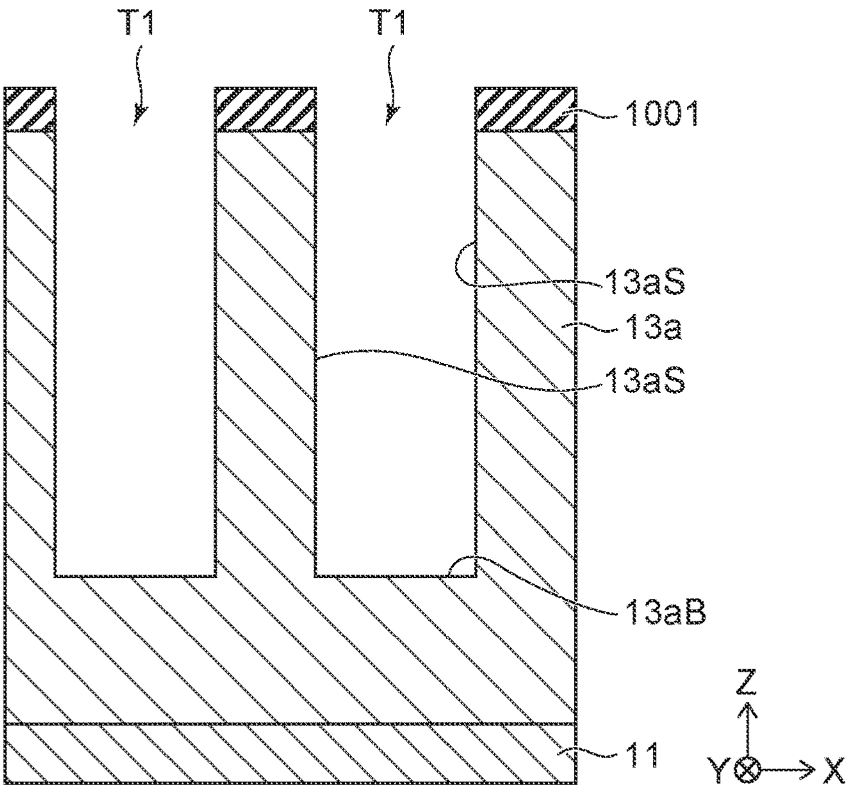
FIG. 4 is a schematic cross-sectional view illustrating a method for manufacturing the semiconductor device according to the first embodiment.

As shown in FIG. 4, a mask 1001 is formed on an intermediate layer 13*a* formed on the first layer 11; and a trench T1 is formed in positions corresponding to the mask 1001. For example, reactive ion etching (RIE) can be used to form the trench T1. The intermediate layer 13*a* is a semiconductor layer of the first conductivity type. The mask 1001 is, for example, a photoresist.

Figure 5:
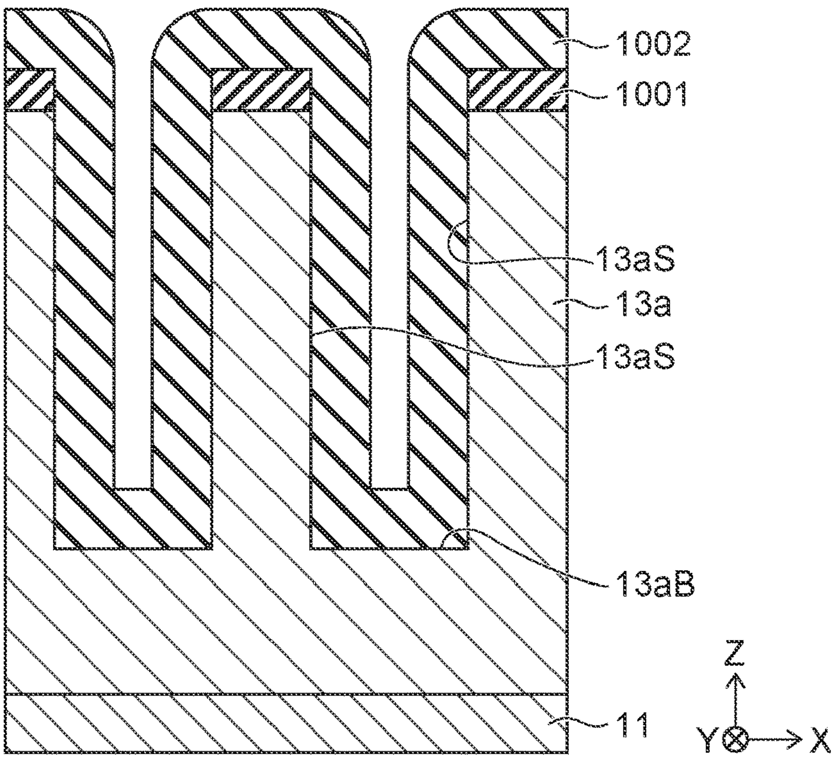
FIG. 5 is a schematic cross-sectional view illustrating the method for manufacturing the semiconductor device according to the first embodiment.

As shown in FIG. 5, an insulating film 1002 is formed to cover the mask 1001 and a sidewall 13*a*S and a bottom surface 13*a*B of the trench T1 that is formed. The insulating film 1002 includes, for example, Si oxide. For example, chemical vapor deposition (CVD) can be used to form the insulating film 1002.

Figure 6:
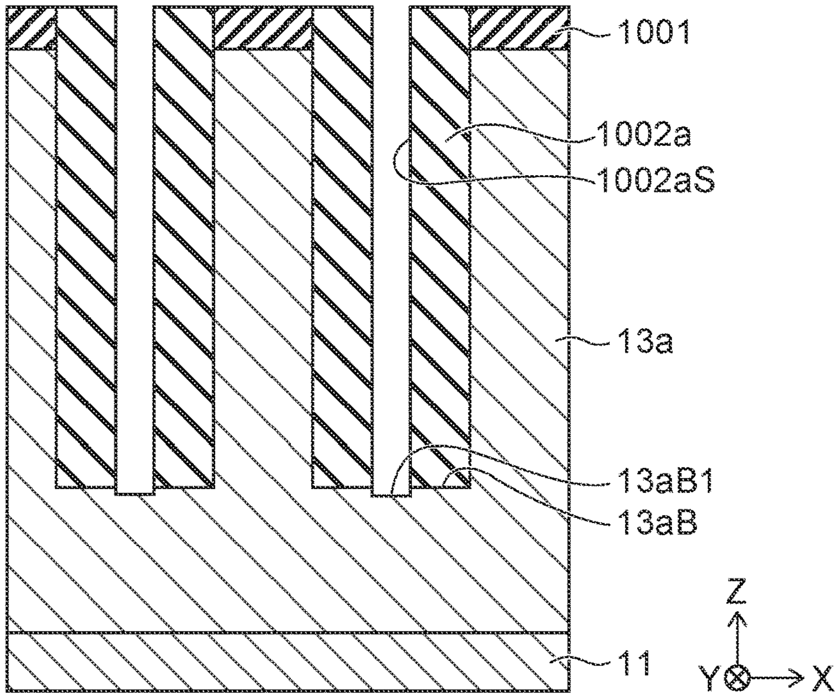
FIG. 6 is a schematic cross-sectional view illustrating the method for manufacturing the semiconductor device according to the first embodiment.

As shown in FIG. 6, the insulating film 1002 is anisotropically patterned in the Z-direction. When anisotropically patterning in the Z-direction, an insulating film 1002*a* is patterned in the Z-direction and is substantially not patterned in directions orthogonal to the Z-direction. When patterning the insulating film 1002, the insulating film 1002 is removed until a bottom surface 13*a*B1 of the intermediate layer 13*a* is exposed. The depth of the bottom surface 13*a*B1 may be equal to the depth of the bottom surface 13*a*B of the insulating film 1002*a* or may be deeper than the bottom surface 13*a*B as in the specific example of FIG. 6. A sidewall 1002*a*S of the insulating film 1002*a* is substantially the same as before patterning. For example, RIE can be used to anisotropically pattern.

Figure 7:
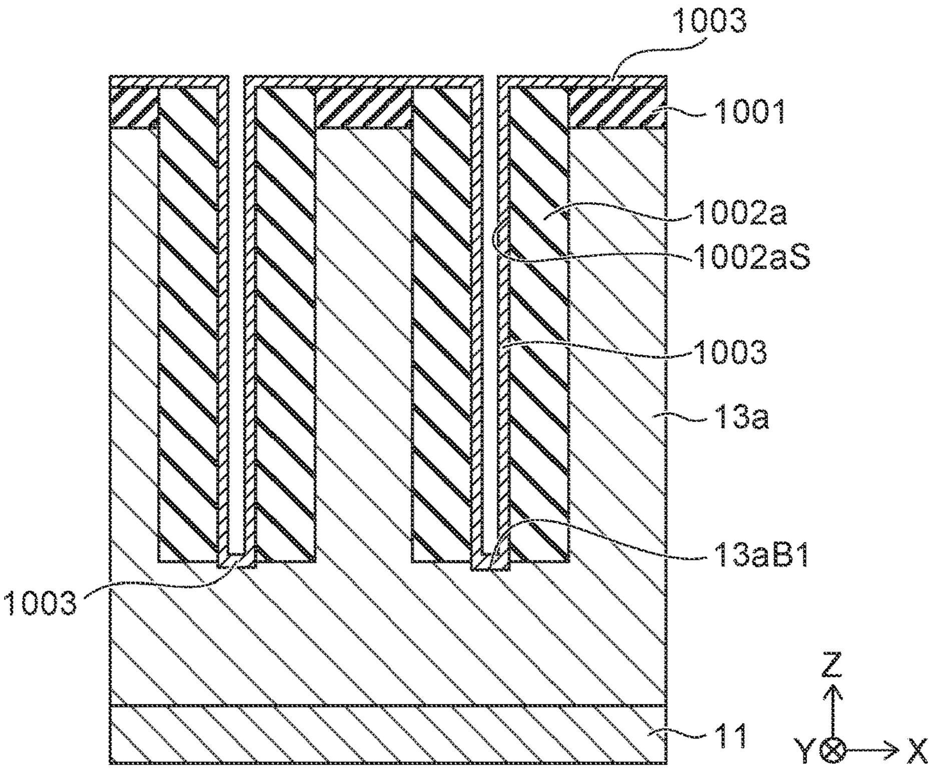
FIG. 7 is a schematic cross-sectional view illustrating the method for manufacturing the semiconductor device according to the first embodiment.

A heavy metal layer 1003 is formed as shown in FIG. 7. The heavy metal layer 1003 is formed on at least the bottom surface 13*a*B1 of the intermediate layer 13*a*. As in the specific example of FIG. 7, the heavy metal layer 1003 may be formed on the sidewall 1002*a*S of the insulating film 1002*a*, on the insulating film 1002*a*, and on the mask 1001. The heavy metal layer 1003 includes Pt or Au as a heavy metal. For example, sputtering can be used to form the heavy metal layer 1003.

In the formation process of the heavy metal layer 1003, the heavy metal reacts with the Si of the intermediate layer 13*a* at the bottom surface 13*a*B1. Therefore, the portion of the heavy metal layer 1003 that contacts the bottom surface 13*a*B1 includes the heavy metal of the heavy metal layer 1003, and a silicide that includes the heavy metal.

Figure 8:
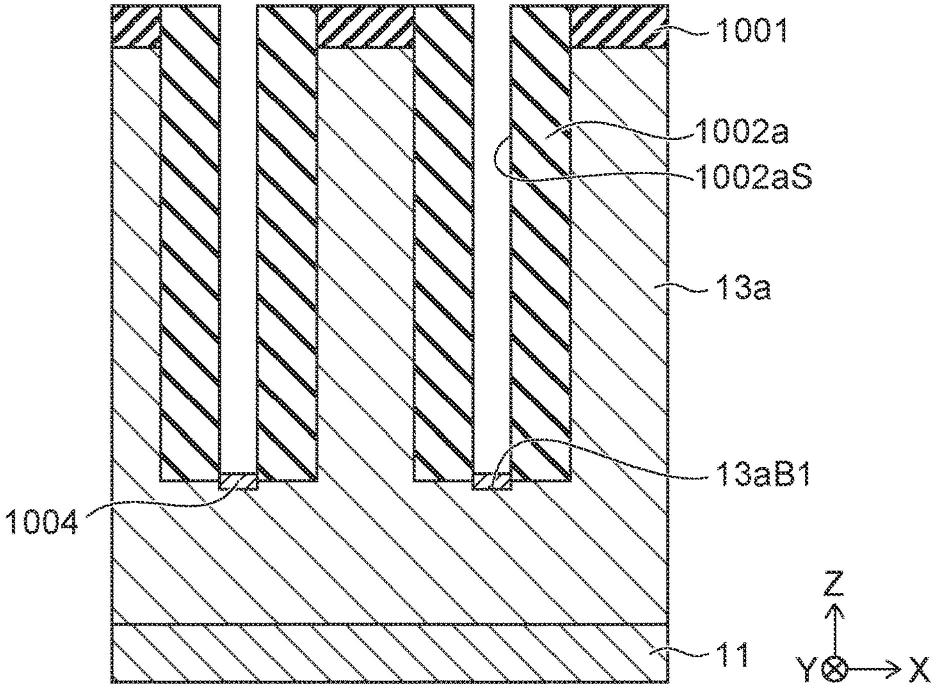
FIG. 8 is a schematic cross-sectional view illustrating the method for manufacturing the semiconductor device according to the first embodiment.

As shown in FIG. 8, the heavy metal layer 1003 is removed so that a silicide layer 1004 that includes the heavy metal and the silicide remains. For example, wet etching can be used to remove the heavy metal layer 1003.

Figure 9:
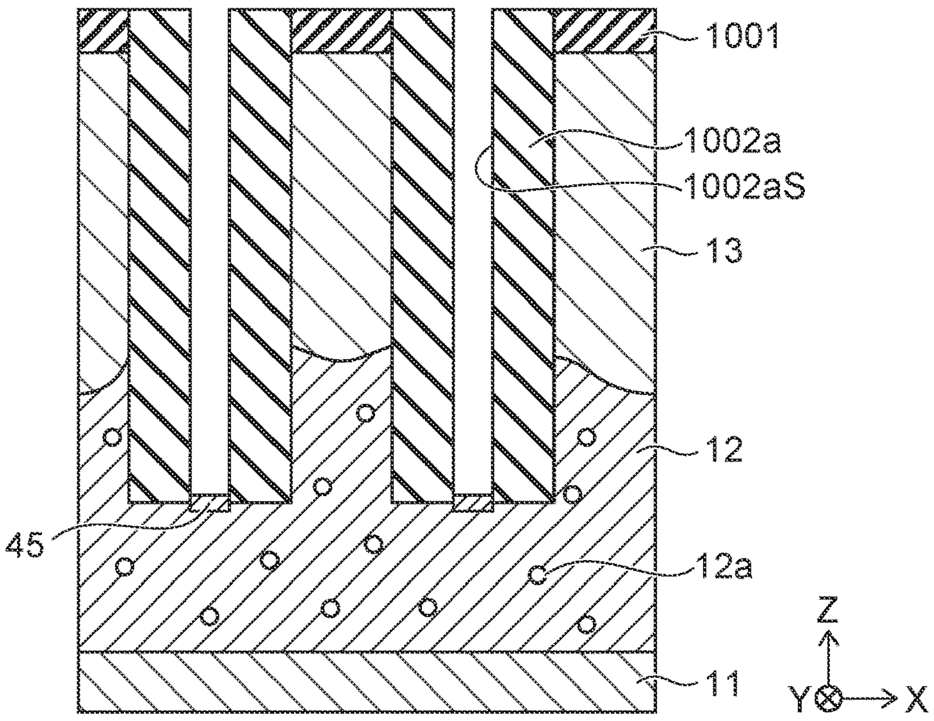
FIG. 9 is a schematic cross-sectional view illustrating the method for manufacturing the semiconductor device according to the first embodiment.

As shown in FIG. 9, the heavy metal 12*a* that is in the silicide layer 1004 is diffused into the intermediate layer 13*a* by heat processing. The second layer 12 is formed in the region into which the heavy metal 12*a* is diffused. The silicide layer 45 is formed by the heavy metal 12*a* in the silicide layer 1004 diffusing into the second layer 12 to reduce the concentration of the heavy metal.

The second layer 12 is formed to be lower than the insulating film 1002*a* because the silicide layer 45 is located at the lower end of the insulating film 1002*a*. As shown in the specific example of FIG. 9, the second layer 12 also is formed higher than the lower end of the insulating film 1002*a* because the heavy metal 12*a* is diffused randomly through the intermediate layer 13*a* by the heat treatment.

For example, the heat processing of the silicide layer 1004 can include rapid thermal annealing (RTA). By appropriately setting and controlling the temperature and time of the RTA, the second layer 12 can be formed by diffusing in a sufficient range while suppressing upward diffusion of the heavy metal 12*a*. For example, the upward spreading of the second layer 12 is suppressed by setting the temperature of the RTA to be about 600° C. to 900° C.

$H^+$ may be irradiated from the first layer 11 side before performing the heat processing of the silicide layer 1004. By irradiating $H^+$ on only the location at which the heavy metal is to be formed, the necessary concentration of the heavy metal can be agglomerated in the $H^+$ irradiation portion; and excessive diffusion of the heavy metal in the subsequent heat treatment can be suppressed.

Figure 10:
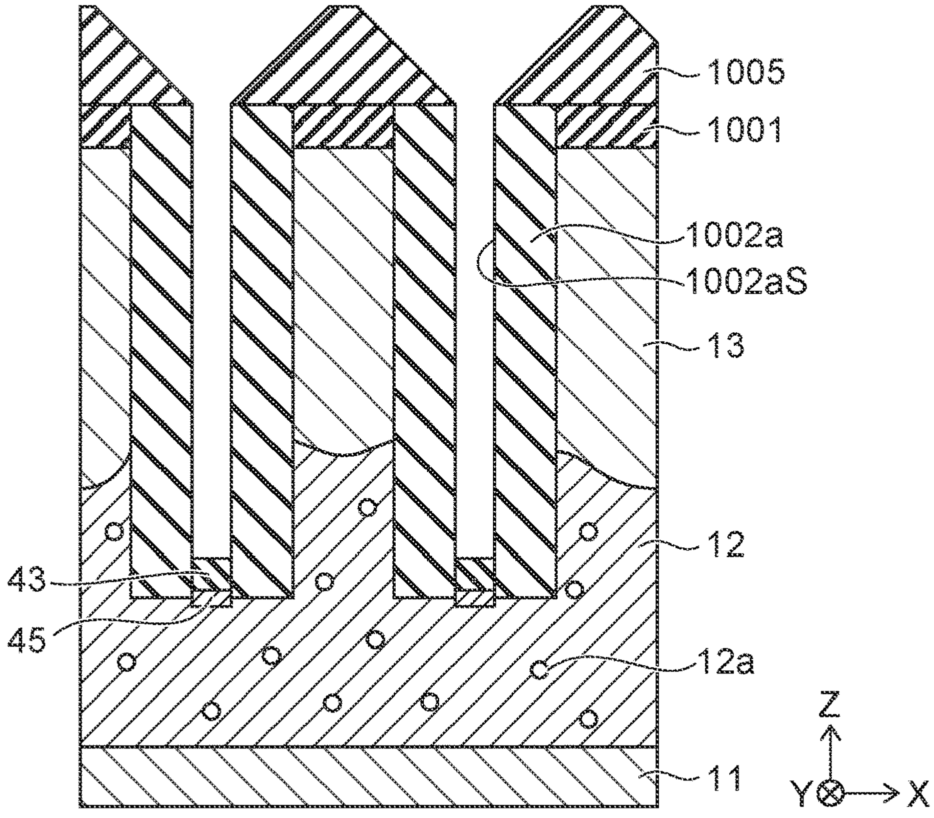
FIG. 10 is a schematic cross-sectional view illustrating the method for manufacturing the semiconductor device according to the first embodiment.

An insulating layer 1005 is formed as shown in FIG. 10. The insulating layer 1005 is formed on the mask 1001, on the insulating film 1002*a*, and on the silicide layer 45. The insulating layer 43 is formed on the silicide layer 45 by the formation process of the insulating layer 1005.

For example, high-density plasma CVD (HDP-CVD) can be used to form the insulating layer 1005. The HDP-CVD can have a self-flattening function by applying a bias voltage to the first layer 11 side. By the self-flattening function as shown in the specific example of FIG. 10, the film can be formed while removing deposits on the sidewall 1002*a*S of the insulating film 1002*a*. When the insulating film 1002 shown in FIG. 5 is formed by CVD and the insulating layer 43 is formed by HDP-CVD, the insulating film 1002 and the insulating layer 43 have different crystal structures.

Figure 11:
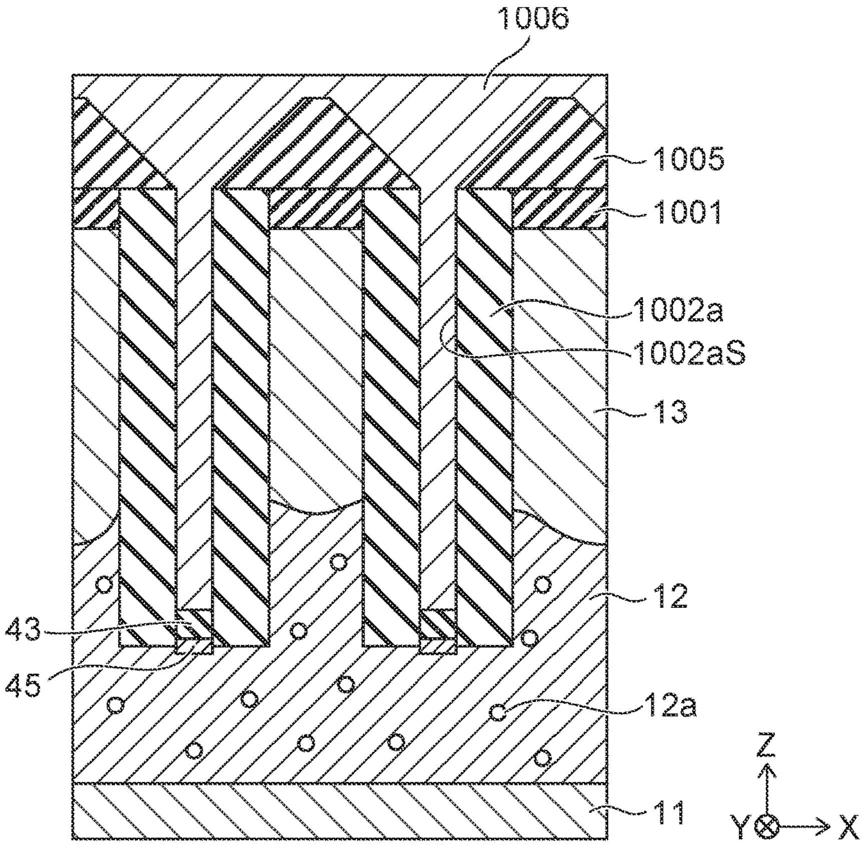
FIG. 11 is a schematic cross-sectional view illustrating the method for manufacturing the semiconductor device according to the first embodiment.

As shown in FIG. 11, a conductive layer 1006 is formed on the insulating layer 43 and on the insulating layer 1005. The conductive layer 1006 also is formed on the sidewall 1002*a*S of the insulating film 1002*a*. The diameter of the sidewall 1002*a*S is sufficiently small when viewed in plan; and the conductive layer 1006 fills the space between the sidewalls 1002*a*S. For example, CVD can be used to form the conductive layer 1006.

Figure 12:
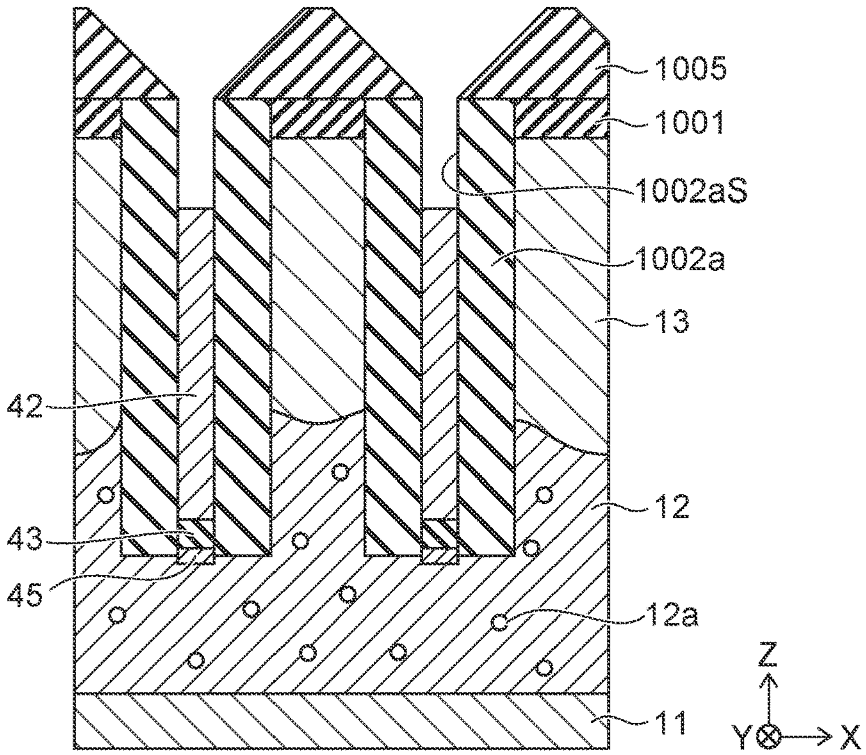
FIG. 12 is a schematic cross-sectional view illustrating the method for manufacturing the semiconductor device according to the first embodiment.

As shown in FIG. 12, the conductive body 42 is formed by removing the conductive layer 1006 until the sidewall 1002*a*S of the upper portion of the insulating film 1002*a* is exposed. For example, chemical dry etching (CDE) can be used to remove the conductive layer 1006.

When the conductive layer 1006 shown in FIG. 11 is formed, the conductive body 42 can be set to have the appropriate Z-direction length by removing the conductive layer 1006 after planarizing the upper surface of the conductive layer 1006. For example, chemical mechanical polishing (CMP) can be used to planarize the upper surface of the conductive layer 1006.

Figure 13:
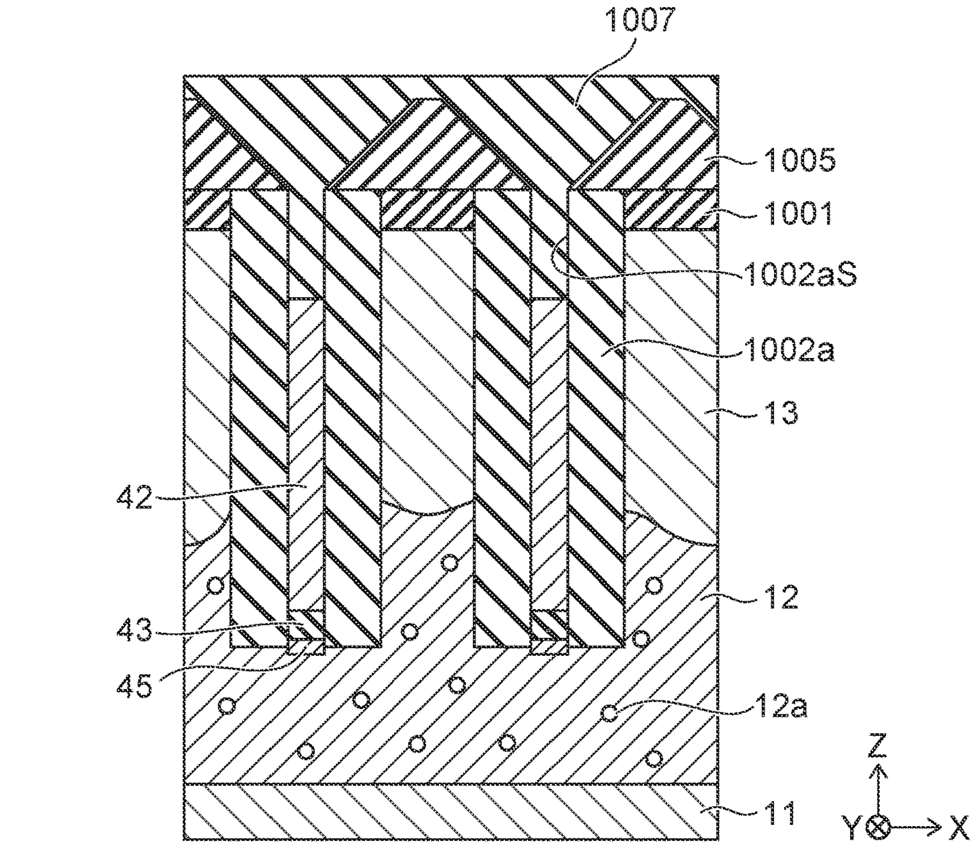
FIG. 13 is a schematic cross-sectional view illustrating the method for manufacturing the semiconductor device according to the first embodiment.

As shown in FIG. 13, an insulating film 1007 is formed on the insulating layer 43 exposed by removing the conductive layer 1006, on the insulating layer 1005, and on the sidewall 1002*a*S. For example, CVD can be used to form the insulating film 1007.

Figure 14:
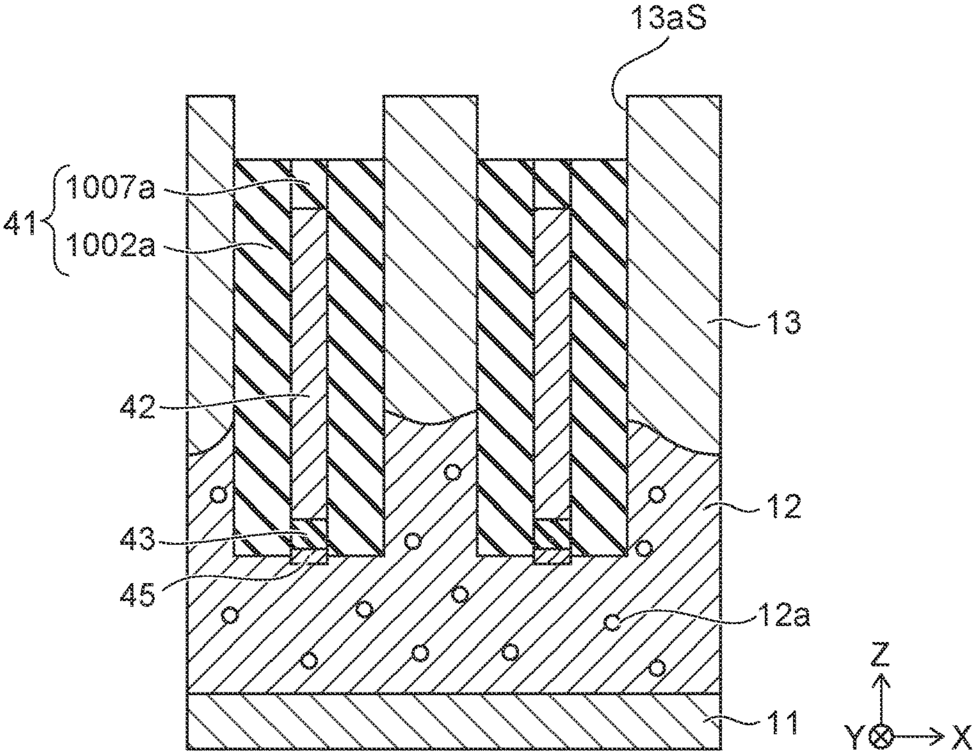
FIG. 14 is a schematic cross-sectional view illustrating the method for manufacturing the semiconductor device according to the first embodiment.

As shown in FIG. 14, the sidewall 13*a*S of the upper portion of the third layer 13 is exposed by removing the insulating layer 1005 and the insulating film 1007. The insulating film 41 is formed of the insulating films 1002*a* and 1007*a*. For example, wet etching can be used to remove the insulating layer 1005 and the insulating film 1007.

Figure 15:
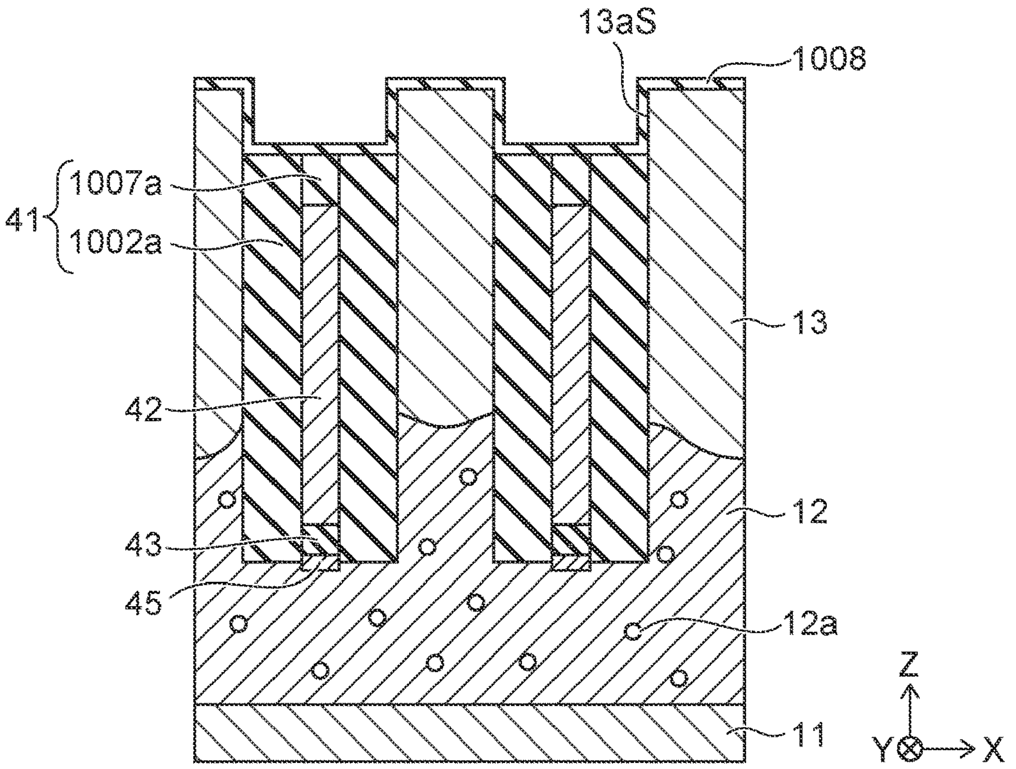
FIG. 15 is a schematic cross-sectional view illustrating the method for manufacturing the semiconductor device according to the first embodiment.

As shown in FIG. 15, a gate insulating film 1008 is formed on the sidewall 13*a*S. For example, thermal oxidation treatment can be used to form the gate insulating film 1008. In the film formation method by thermal oxidation, the gate insulating film 1008 also is formed on the third layer 13 and on the insulating film 41.

Figure 16:
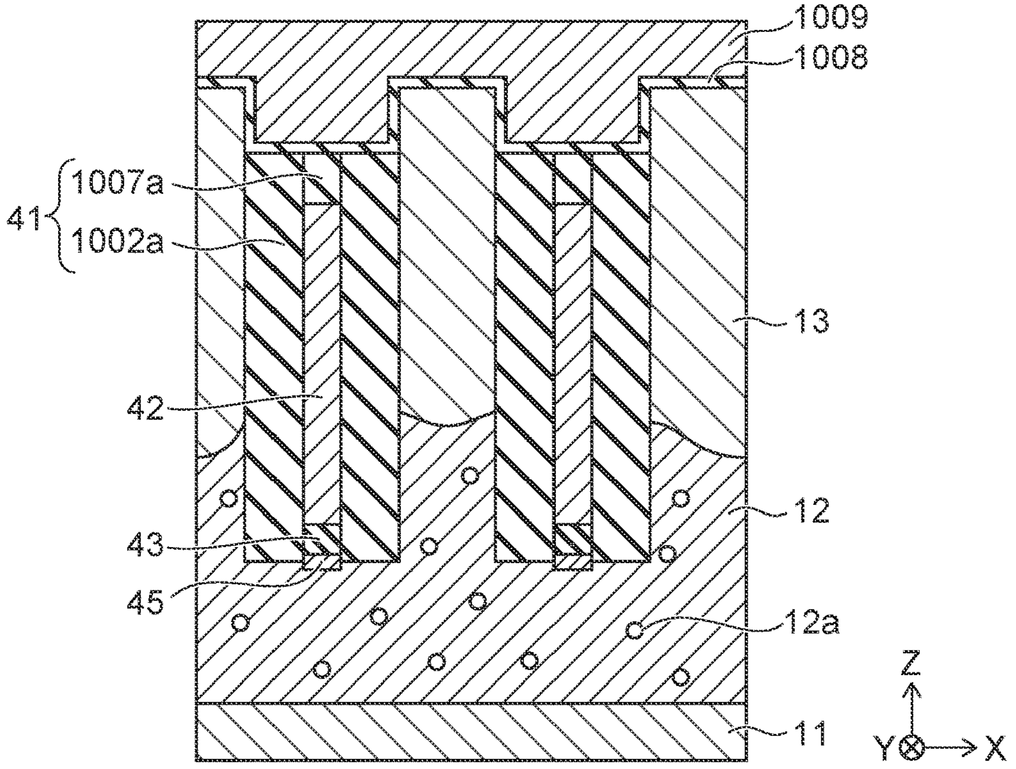
FIG. 16 is a schematic cross-sectional view illustrating the method for manufacturing the semiconductor device according to the first embodiment.

As shown in FIG. 16, a gate electrode layer 1009 is formed on the gate insulating film 1008. For example, low pressure CVD (LPCVD) can be used to form the gate electrode layer 1009.

Figure 17:
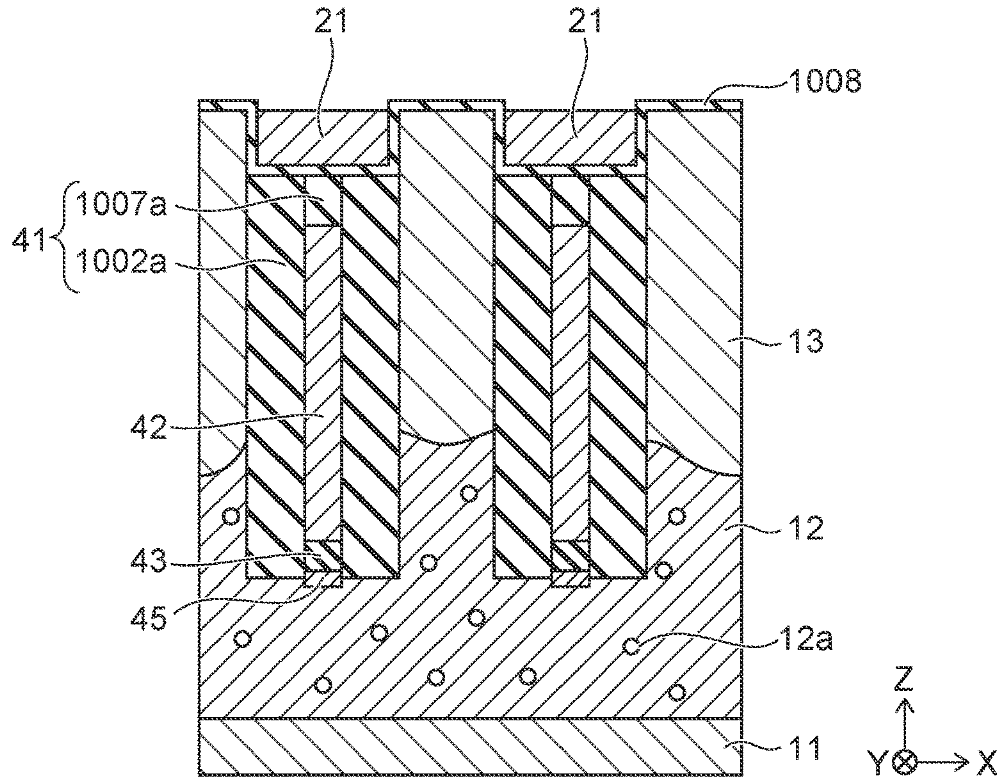
FIG. 17 is a schematic cross-sectional view illustrating the method for manufacturing the semiconductor device according to the first embodiment.

As shown in FIG. 17, the gate electrode 21 is formed by removing the upper portion of the gate electrode layer 1009. For example, chemical dry etching (CDE) can be used to remove the gate electrode layer 1009.

Figure 18:
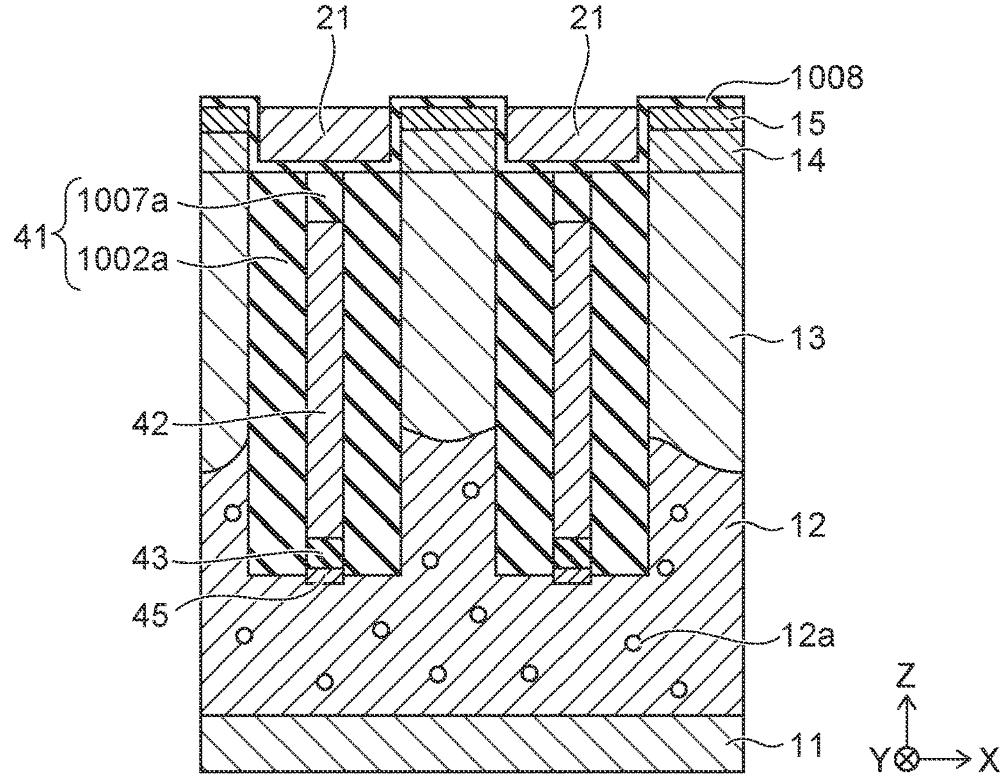
FIG. 18 is a schematic cross-sectional view illustrating the method for manufacturing the semiconductor device according to the first embodiment.

As shown in FIG. 18, the fourth layer 14 is formed in the upper portion of the third layer 13. Subsequently, the fifth layer 15 is formed on the fourth layer 14. For example, ion implantation can be used to form the fourth layer 14 and the fifth layer 15.

Figure 19:
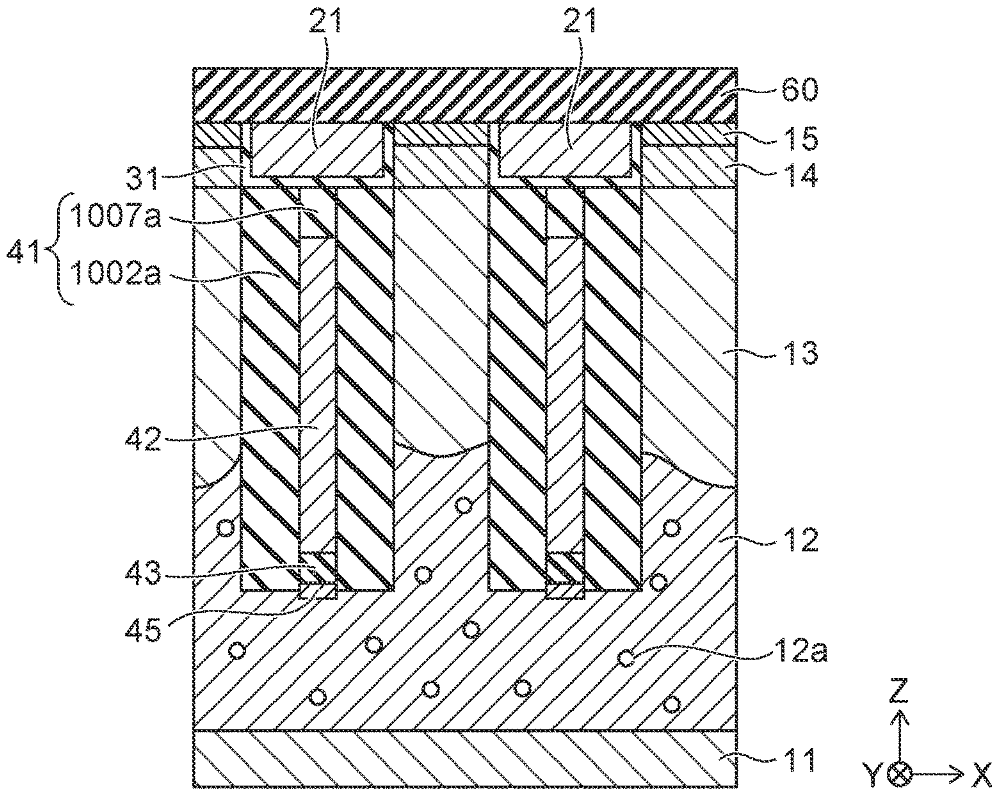
FIG. 19 is a schematic cross-sectional view illustrating the method for manufacturing the semiconductor device according to the first embodiment.

As shown in FIG. 19, the inter-layer insulating film 60 is formed on the gate electrode 21 and the fifth layer 15. For example, CVD can be used to form the inter-layer insulating film 50.

Figure 20:
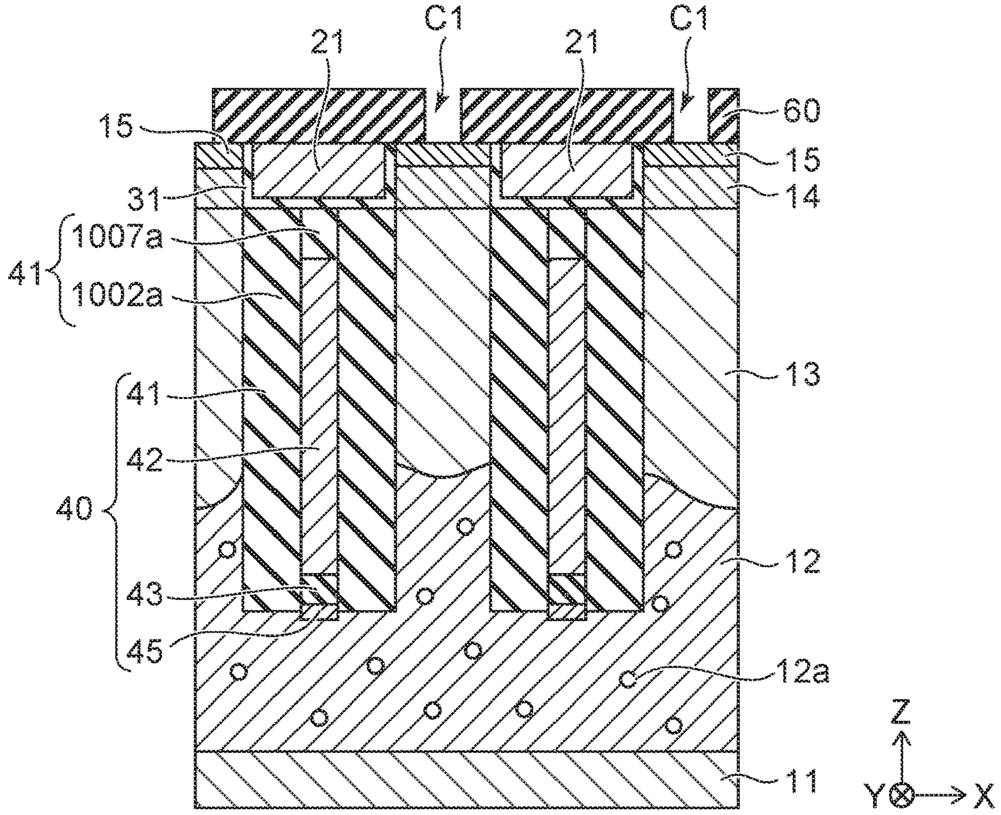
FIG. 20 is a schematic cross-sectional view illustrating the method for manufacturing the semiconductor device according to the first embodiment.

As shown in FIG. 20, a contact C1 is formed in the inter-layer insulating film 60. The contact C1 is formed to extend through the inter-layer insulating film 60 and expose the fifth layer 15.

Figure 21:
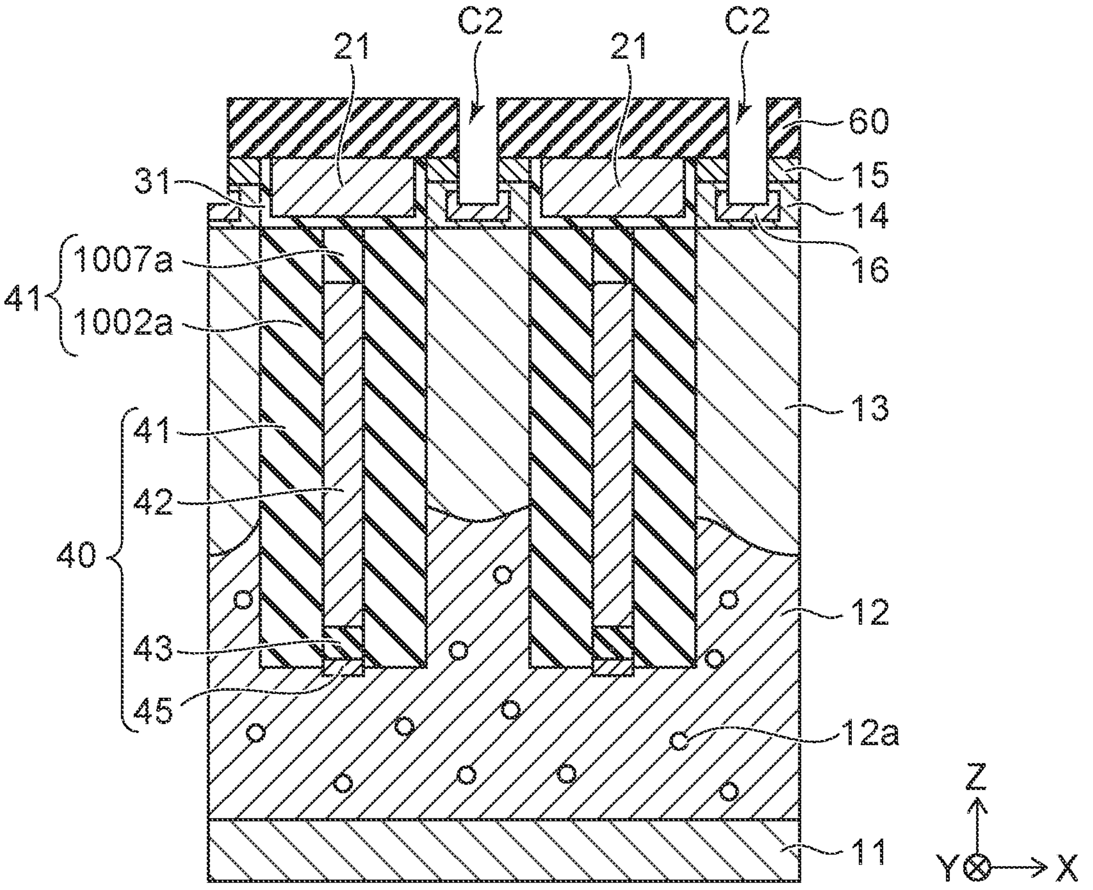
FIG. 21 is a schematic cross-sectional view illustrating the method for manufacturing the semiconductor device according to the first embodiment.

As shown in FIG. 21, the sixth layer 16 is formed in the fourth layer 14 by, for example, using ion implantation to irradiate ions forming a p-type impurity via a contact C2.

Figure 22:
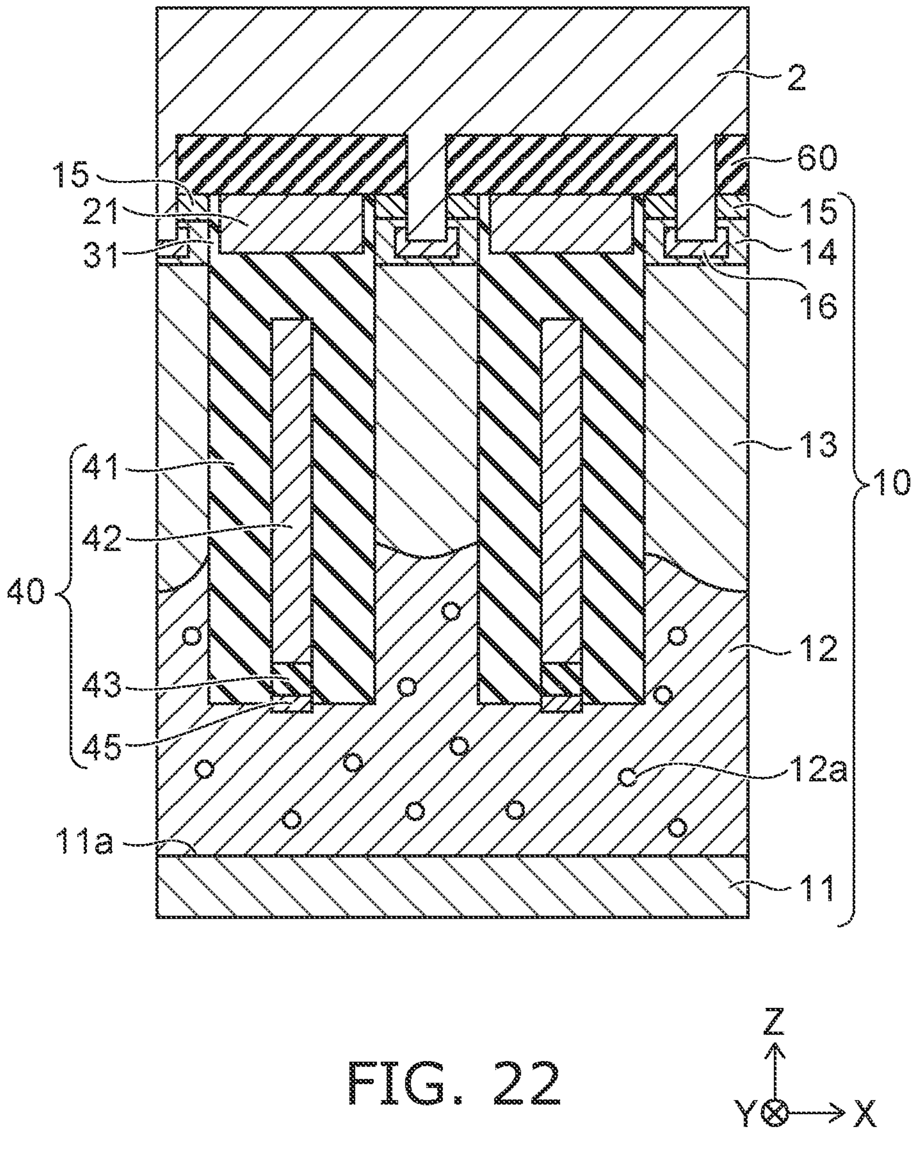
FIG. 22 is a schematic cross-sectional view illustrating the method for manufacturing the semiconductor device according to the first embodiment.

As shown in FIG. 22, the second electrode 2 is formed by forming a conductive layer on the inter-layer insulating film 60 and by forming the conductive layer in the contact C2 as well. Thereafter, the semiconductor device 100 can be formed by forming the first electrode at the back surface of the first layer 11.

In the semiconductor device 100 according to the embodiment, the second layer 12 that includes the heavy metal 12*a* can be formed between the first layer 11 and the third layer 13 by the manufacturing method described above. The heavy metal 12*a* is diffused by heat processing of the heavy metal included in the silicide layer 1004 formed at the lower end of the insulating film 41 included in the structure body 40. By appropriately setting the temperature and time of the heat processing, the diffusion of the heavy metal 12*a* into the upper portion of the structure body 40 can be suppressed. Therefore, the second layer 12 that includes the heavy metal 12*a* is formed at the lower portion of the structure body 40; and substantially the entire side surface of the structure body 40 contacts the third layer 13. As a result, the semiconductor device 100 can be manufactured in which the reverse recovery time in the diode operation is reduced without increasing the leakage current when the reverse bias is applied.

Instead of the method of introducing the heavy metal 12*a* from the lower end of the structure body 40, a method may be considered in which a layer that includes the heavy metal 12*a* is introduced, for example, via the contact C1 described with reference to FIG. 21. In such a case, the third layer 13 is located on the first layer 11; and a layer that includes the heavy metal 12*a* is located between the third layer 13 and the fourth layer 14. In such a case, a layer that includes a high concentration of the heavy metal 12*a* is formed in a region that is depleted when the reverse bias is applied. Therefore, the reverse recovery time is reduced, but the leakage current is increased.

Specifically, to introduce the heavy metal 12*a* via the contact C1, a method may be considered in which a layer of the heavy metal 12*a* is formed at the wall surface of the contact C1, and then the heavy metal 12*a* is diffused by performing heat processing. In such a case, a silicide layer of the heavy metal remains at the wall surface of the contact C1; therefore, when the second electrode 2 is subsequently formed, the contact resistance between the contact C1 and the second electrode 2 may be increased, and the on-resistance may increase.

In contrast, according to the method for manufacturing the semiconductor device 100 described above, heat processing is performed after forming the silicide layer 1004 at the lower end of the structure body 40; and a layer or the like that increases the on-resistance is not formed at positions that contact either of the first electrode 1 or the second electrode 2. Therefore, the semiconductor device 100 that has a stable and low on-resistance can be manufactured.

Second Embodiment

Figure 23:
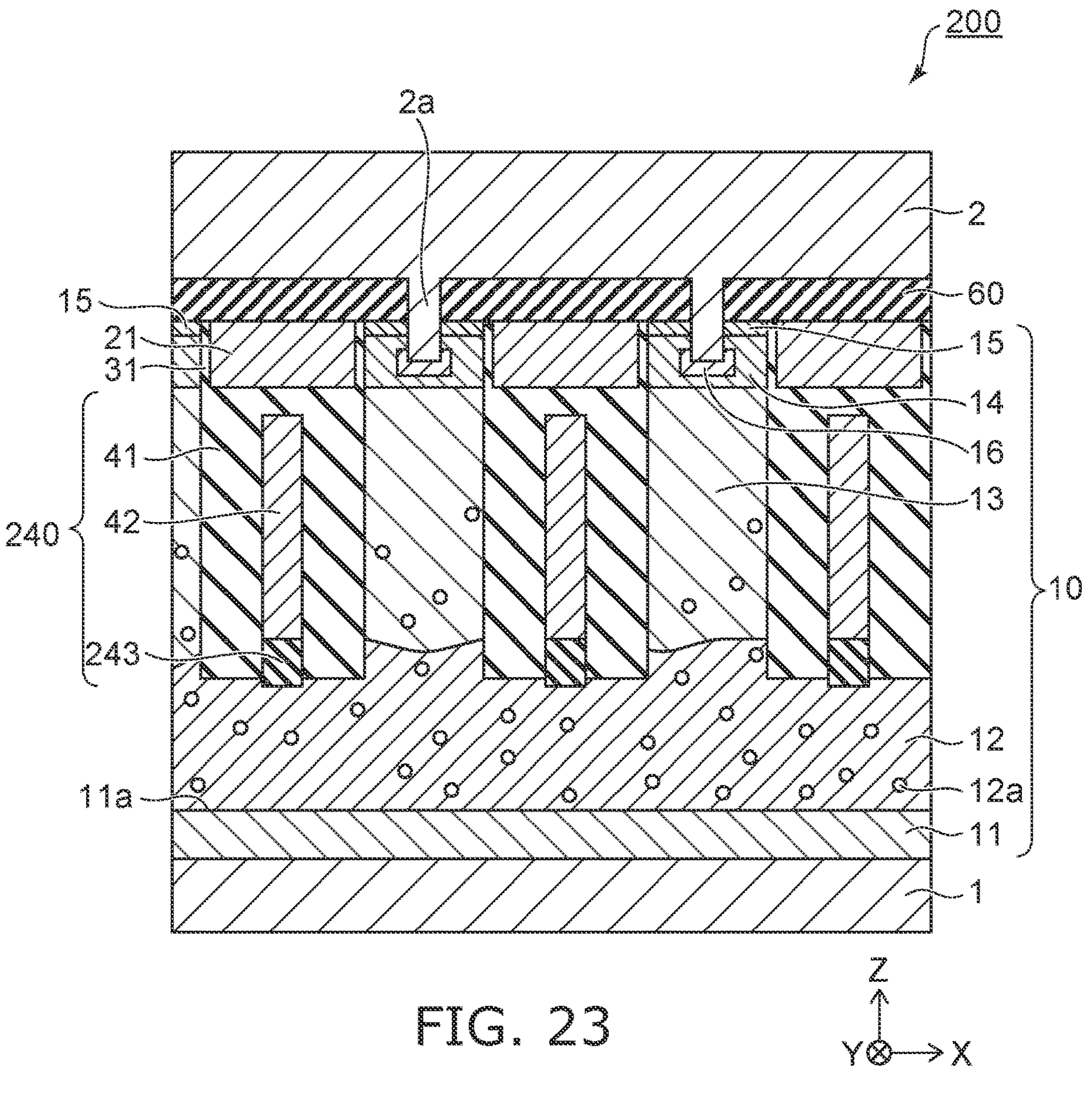
FIG. 23 is a schematic cross-sectional view illustrating a semiconductor device according to a second embodiment.

FIG. 23 is a schematic cross-sectional view illustrating a semiconductor device according to a second embodiment.

FIG. 23 is an auxiliary cross-sectional view at a position corresponding to line AA of FIG. 1.

As shown in FIG. 23, the configuration of a structure body 240 of the semiconductor device 200 according to the embodiment is different from that of the semiconductor device 100 of FIG. 2. Otherwise, the components of the semiconductor device 200 are the same as the components of the semiconductor device 100 of FIG. 2; the same components are marked with the same reference numerals; and a detailed description is omitted as appropriate.

Similarly to the semiconductor device 100 according to the first embodiment, multiple structure bodies 240 are located respectively under the multiple gate electrodes 21 and extend in the Z-direction. Similarly to the semiconductor device 100, the structure bodies 240 contact portions of the second layer 12 at the lower portions of the structure bodies 240, and contact the second layer 12 at least at the bottom surfaces of the structure bodies 240.

The structure body 240 includes the insulating film 41, the conductive body 42, and an insulating layer 243. The conductive body 42 extends in the direction of the Z-axis below the gate electrode 21. The insulating film 41 is located between the gate electrode 21 and the conductive body 42. The conductive body 42 is located on the insulating layer 243. The insulating layer 243 is located on the second layer 12.

The insulating film 41 extends in the Z-direction below the gate electrode 21. Similarly to the example of FIG. 2, the insulating film 41 is continuous with the gate insulating film 31.

The insulating film 41 surrounds the perimeters of the conductive body 42 and the insulating layer 243. The insulating layer 243 contacts the second layer 12 on the second layer 12. The second layer 12 contacts the bottom surface of the insulating layer 243 and a portion of the side surface continuous with the bottom surface of the insulating layer 243. Similarly to the silicide layer 45 of the semiconductor device 100 shown in FIG. 2, the insulating layer 243 protrudes into the second layer 12 from the lower end of the insulating film 41.

As described below with reference to FIG. 27, the insulating layer 243 includes, for example, silicon oxide formed by HDP-CVD, and has a different crystal structure from the insulating film 41 that includes silicon oxide formed by CVD.

The semiconductor device 200 according to the embodiment has effects similar to those of the semiconductor device 100 according to the first embodiment. In other words, in the off-state of the semiconductor device 200, the leakage current between the first electrode 1 and the second electrode 2 is small because the depletion layer of the third layer 13 spreads to the entire third layer 13 between the structure bodies 240, and the concentration of the heavy metal 12*a* in the third layer 13 is low. The second layer 12 that includes the heavy metal 12*a* and has a higher concentration of the heavy metal 12*a* than the third layer 13 is included at the lower portion of the structure body 240; and the heavy metal 12*a* functions as recombination centers of the minority carriers; therefore, the reverse recovery time in the diode operation of the semiconductor device 200 is reduced.

In the semiconductor device 200, the depletion layer of the third layer 13 spreads through the entire third layer 13 between the structure bodies 240 because the conductive body 42 of the structure body 240 functions as a field plate. Therefore, the first-conductivity-type impurity concentration of the third layer 13 can be increased, and the on-resistance of the semiconductor device 200 can be reduced.

A method for manufacturing the semiconductor device 200 according to the embodiment will now be described.

FIGS. 24 to 27 are schematic cross-sectional views illustrating the method for manufacturing the semiconductor device according to the second embodiment.

The formation process of the second layer 12 of the method for manufacturing the semiconductor device 200 is different from that of the method for manufacturing the semiconductor device 100 according to the first embodiment; and the other processes are the same. In the following description, the processes up to FIGS. 4 to 6 are performed, after which the processes shown in FIGS. 24 to 27 are performed, and then the processes of FIGS. 11 to 21 are applied.

Figure 24:
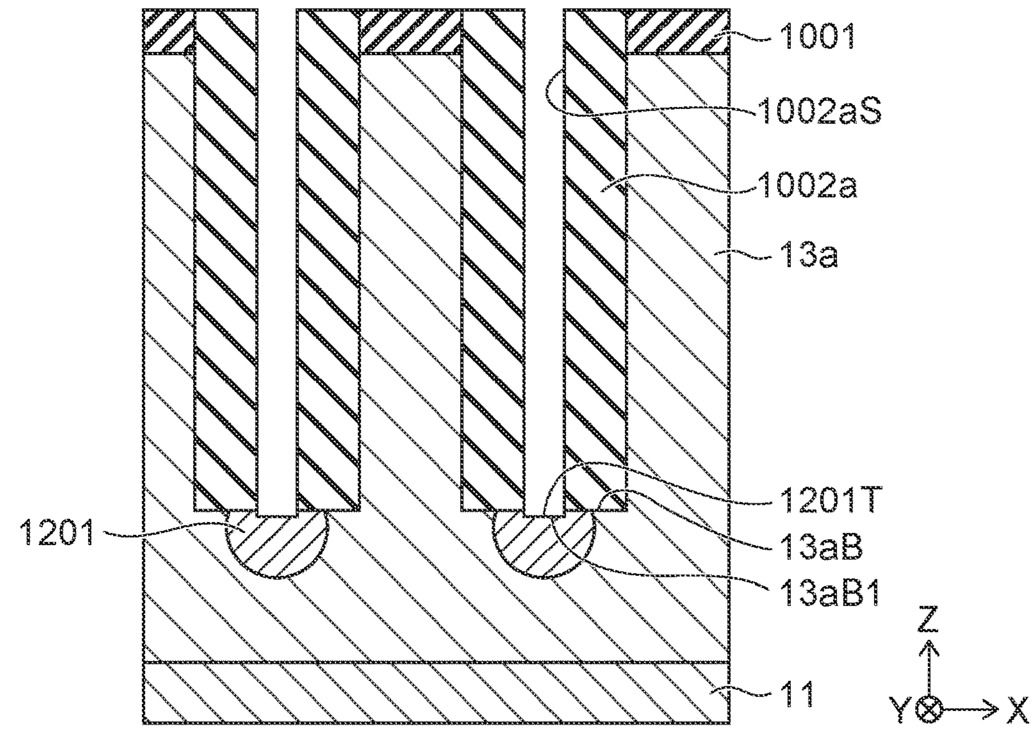
FIG. 24 is a schematic cross-sectional view illustrating a method for manufacturing the semiconductor device according to the second embodiment.

After the process of anisotropically patterning the insulating film 1002 described with reference to FIG. 6 in the Z-direction, a heavy metal region 1201 is formed as shown in FIG. 24. The heavy metal region 1201 is formed by, for example, ion implantation via the bottom surface 13*a*B1 of the intermediate layer 13*a*. The heavy metal region 1201 is formed in the intermediate layer 13*a* from the bottom surface 13*a*B1 by appropriately setting the dose and acceleration energy of the heavy metal 12*a* in the ion implantation. An upper end 1201T of the heavy metal region 1201 contacts the bottom surface 13*a*B1. The upper end 1201T is exposed at the bottom portion of the region surrounded with the sidewall 1002*a*S of the insulating film 1002*a*.

Figure 25:
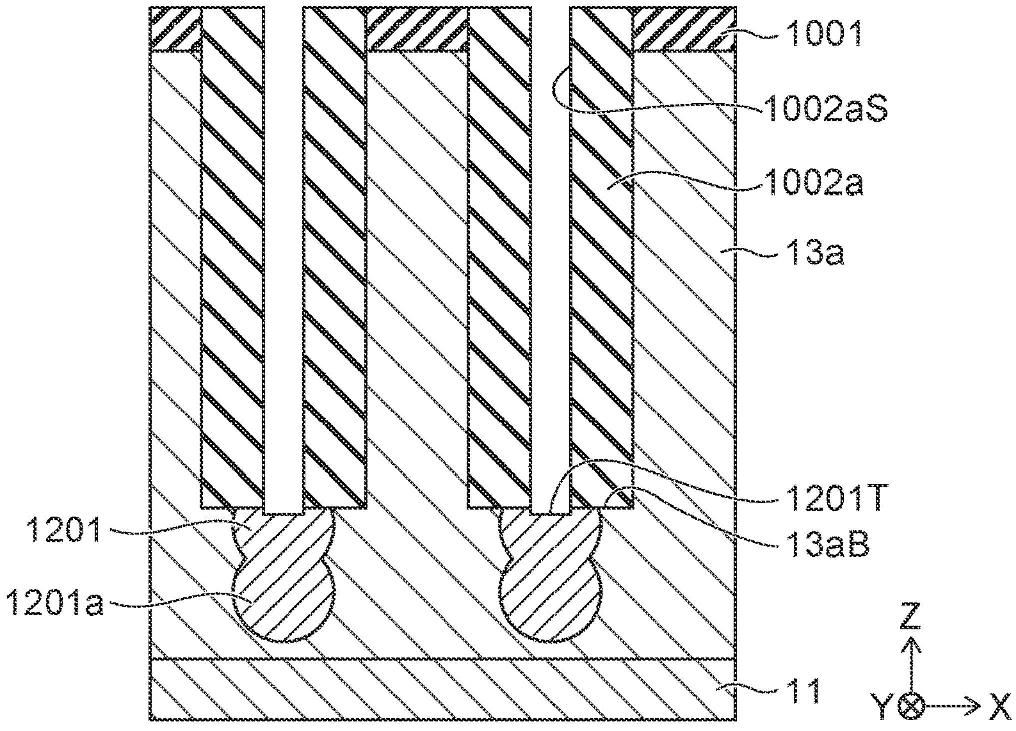
FIG. 25 is a schematic cross-sectional view illustrating the method for manufacturing the semiconductor device according to the second embodiment.

FIG. 25 shows a cross section of a modification of the method for manufacturing the semiconductor device 200, and shows when a heavy metal region 1201*a* is formed at a deeper position of the intermediate layer 13*a* than the heavy metal region 1201. As shown in FIG. 25, the heavy metal region 1201*a* is formed to be continuous with the heavy metal region 1201 below the heavy metal region 1201. For example, the heavy metal region 1201*a* is formed at the appropriate position in the ion implantation of the heavy metal 12*a* by setting the acceleration energy to be greater than when forming the heavy metal region 1201.

Figure 26:
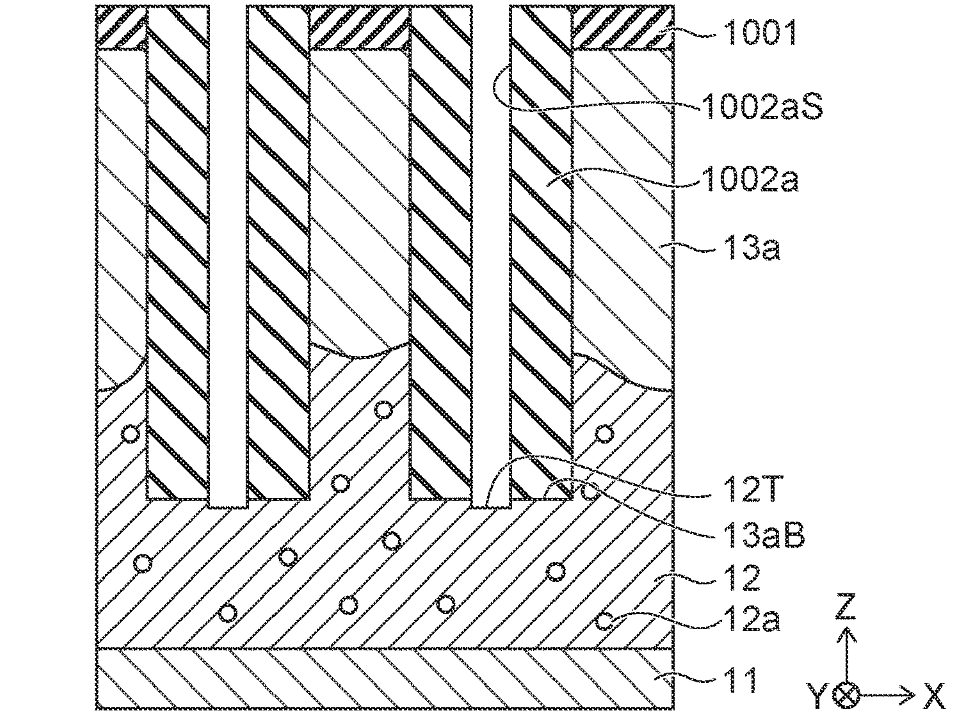
FIG. 26 is a schematic cross-sectional view illustrating the method for manufacturing the semiconductor device according to the second embodiment.

As shown in FIG. 26, the heavy metal 12*a* in the heavy metal region 1201 is diffused into the intermediate layer 13*a* by heat processing. The second layer 12 is formed in the region into which the heavy metal 12*a* is diffused. An end portion 12T of the second layer 12 is exposed at the bottom portion of the region surrounded with the sidewall 1002*a*S of the insulating film 1002*a*. The heat processing can include, for example, RTA.

Figure 27:
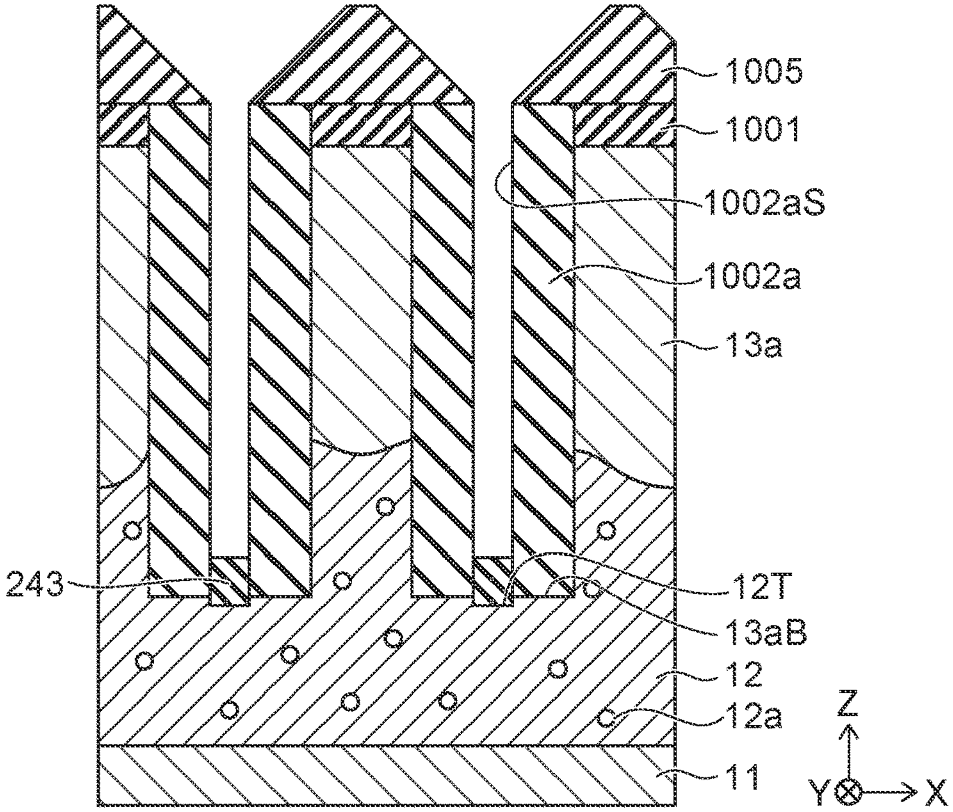
FIG. 27 is a schematic cross-sectional view illustrating the method for manufacturing the semiconductor device according to the second embodiment.

The insulating layer 1005 is formed as shown in FIG. 27. The insulating layer 1005 is formed on the mask 1001, on the insulating film 1002*a*, and on the second layer 12. Similarly to the process described with reference to FIG. 10, the insulating layer 1005 is formed by HDP-CVD. As a result, the insulating layer 243 is formed at the bottom portion of the region surrounded with the sidewall 1002*a*S. The insulating layer 243 has a different crystal structure from the insulating film 1002.

Thereafter, the semiconductor device is formed by applying the processes described with reference to FIGS. 11 to 21.

To form the second layer 12 according to the method for manufacturing the semiconductor device 200 according to the embodiment, the heavy metal region 1201 that includes the heavy metal 12*a* is formed at the lower portion of the structure body 240 by using ion implantation. In the ion implantation, the heavy metal region 1201 can be formed at the appropriate position in the intermediate layer 13*a* by setting the dose and acceleration energy of the heavy metal 12*a*. Therefore, substantially the entire side surface of the insulating film 41 of the structure body 240 can be the second layer 12 having a low concentration of the heavy metal 12*a*; and both a decreased leakage current and a reduced reverse recovery time in the diode operation can be realized.

Thus, a semiconductor device can be realized in which the reverse recovery characteristics when in the diode operation are improved.

In the embodiments above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a second electrode;

a semiconductor part located between the first electrode and the second electrode;

a gate electrode located in the semiconductor part, the gate electrode extending from the second electrode toward the first electrode; and a structure body located between the gate electrode and the first electrode, the structure body extending from the gate electrode side toward the first electrode side in the semiconductor part, the semiconductor part including a first layer located on the first electrode, the first layer being electrically connected to the first electrode, the first layer being of a first conductivity type, a second layer located on the first layer, the second layer including a heavy metal, the second layer being of the first conductivity type, a third layer located on the second layer, the third layer including the heavy metal, the third layer having a lower concentration of the heavy metal than the second layer, the third layer being of the first conductivity type, a fourth layer located on the third layer, the fourth layer facing the gate electrode via a gate insulating film, the fourth layer being electrically connected to the second electrode, the fourth layer being of a second conductivity type, and a fifth layer located on the fourth layer, the fifth layer being electrically connected to the second electrode, the fifth layer being of the first conductivity type, the structure body including a silicide layer contacting the second layer, an insulating layer located on the silicide layer, a conductive body located on the insulating layer, the conductive body extending from under the gate electrode toward the insulating layer, the conductive body being electrically isolated from the gate electrode, and an insulating film located between the conductive body and the second layer and between the conductive body and the third layer, a bottom surface of the silicide layer and at least a portion of a side surface of the silicide layer contacting the second layer.

2. The device according to claim 1, wherein the conductive body faces the third layer via the insulating film from an upper end of the conductive body to a lower end of the conductive body.

3. The device according to claim 1, wherein the insulating film contacts the second layer at a lower portion of the insulating film.

4. The device according to claim 1, wherein the insulating layer has a different crystal structure from the insulating film.

5. The device according to claim 1, wherein the first layer includes a first surface, the second layer being located at the first surface, and a first distance from a lower end of the insulating film to the first surface is greater than a second distance from a lower end of a bottom surface of the silicide layer to the first surface.

6. A semiconductor device, comprising:

a first electrode;

a second electrode;

a semiconductor part located between the first electrode and the second electrode;

a gate electrode located in the semiconductor part, the gate electrode extending from the second electrode toward the first electrode; and a structure body located between the gate electrode and the first electrode, the structure body extending from the gate electrode side toward the first electrode side in the semiconductor part, the semiconductor part including a first layer located on the first electrode, the first layer being electrically connected to the first electrode, the first layer being of a first conductivity type, a second layer located on the first layer, the second layer including a heavy metal, the second layer being of the first conductivity type, a third layer located on the second layer, the third layer including the heavy metal, the third layer having a lower concentration of the heavy metal than the second layer, the third layer being of the first conductivity type, a fourth layer located on the third layer, the fourth layer facing the gate electrode via a gate insulating film, the fourth layer being electrically connected to the second electrode, the fourth layer being of a second conductivity type, and a fifth layer located on the fourth layer, the fifth layer being electrically connected to the second electrode, the fifth layer being of the first conductivity type, the structure body including an insulating layer contacting the second layer on the second layer, a conductive body located on the insulating layer, the conductive body extending from under the gate electrode toward the insulating layer, the conductive body being electrically isolated from the gate electrode, and an insulating film located between the conductive body and the second layer and between the conductive body and the third layer, the insulating layer having a different crystal structure from the insulating film.

7. The device according to claim 1, wherein the heavy metal includes one of Pt or Au.

8. The device according to claim 7, wherein the concentration of the heavy metal in the second layer is $1\times10^{13}$ $cm^{-3}$ to $1\times10^{20}$ $cm^{-3}$.

9. The device according to claim 6, wherein the heavy metal includes one of Pt or Au.

10. The device according to claim 9, wherein the concentration of the heavy metal in the second layer is $1\times10^{13}$ $cm^{-3}$ to $1\times10^{20}$ $cm^{-3}$.

* * * * *